United States Patent
Yamashita

(10) Patent No.: US 8,672,434 B2
(45) Date of Patent: Mar. 18, 2014

(54) WIRING CONNECTION STRUCTURE OF DRIVER IC AND LIQUID DROPLET JETTING APPARATUS

(75) Inventor: Toru Yamashita, Nagoya (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 508 days.

(21) Appl. No.: 13/014,440

(22) Filed: Jan. 26, 2011

(65) Prior Publication Data

US 2011/0181643 A1 Jul. 28, 2011

(30) Foreign Application Priority Data

Jan. 28, 2010 (JP) .................................. 2010-016974
Jan. 28, 2010 (JP) .................................. 2010-016975

(51) Int. Cl.
*B41J 29/38* (2006.01)

(52) U.S. Cl.
USPC ..................................... 347/10; 347/5; 347/9

(58) Field of Classification Search
USPC .......................................................... 347/10
See application file for complete search history.

(56) References Cited

U.S. PATENT DOCUMENTS 6,407,508 B1    6/2002  Kawada et al.
2006/0065983 A1* 3/2006  Chia et al. .................... 257/782

FOREIGN PATENT DOCUMENTS

JP    2001-013883    1/2001
JP    2007-083707    4/2007
JP       2007083707  * 4/2007  ............... B41J 2/045

* cited by examiner

*Primary Examiner* — Uyen Chau N Le
*Assistant Examiner* — Kajli Prince
(74) *Attorney, Agent, or Firm* — Frommer Lawrence & Haug LLP

(57) ABSTRACT

A wiring connection structure of driver IC is provided. The wiring connection structure includes: a driver IC installed on a wiring substrate; output wires connected to output terminals of the driver IC; input wires including multiple kinds of signal input wires for transmitting multiple kinds of signals different from each other in susceptibility to an influence of noise; and bonding wires which connect input terminals of the driver IC to connection terminals of the input wires, and have an identical length to each other and a different loop height from the wiring substrate. The intervals between the input terminals are narrower than those between the connection terminals, and the loop height is higher with respect to the bonding wire connected to the connection terminal of the signal input wire for transmitting a signal more susceptible to the influence of noise.

14 Claims, 14 Drawing Sheets

→ SCANNING DIRECTION
↙ PAPER FEEDING DIRECTION

Fig. 10A
Fig. 10B
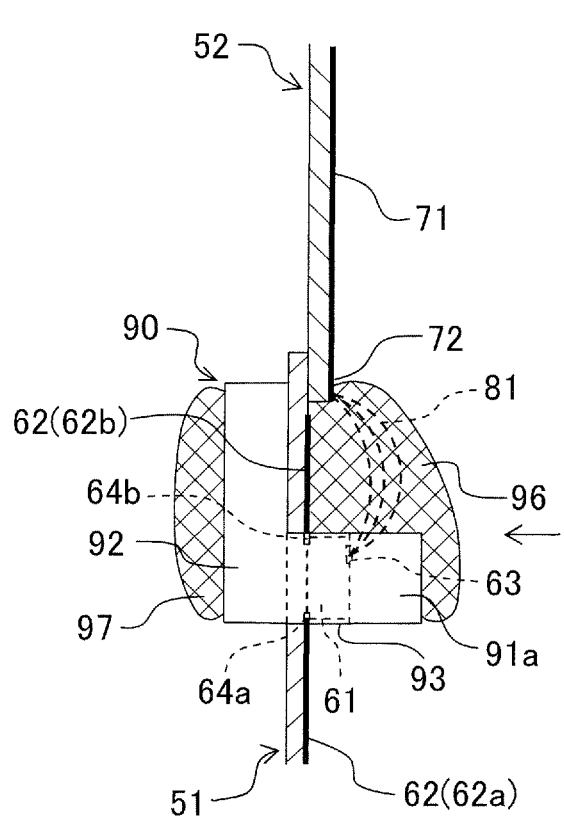
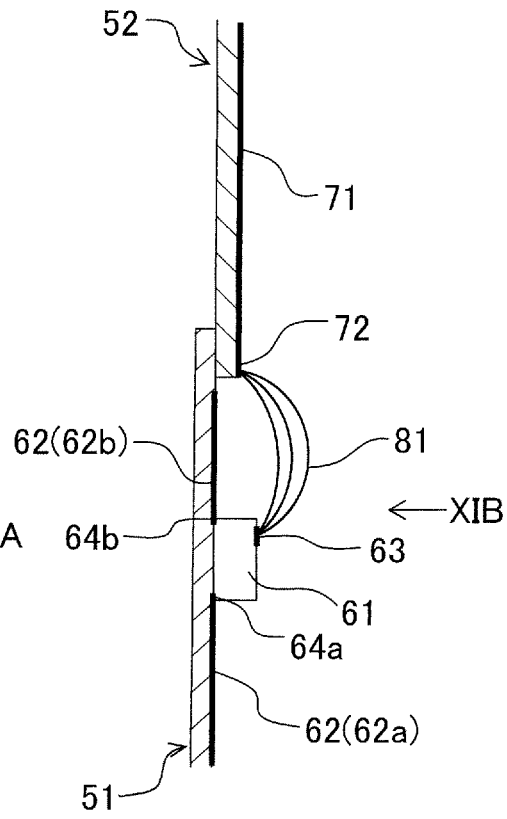

WIRING CONNECTION STRUCTURE OF DRIVER IC AND LIQUID DROPLET JETTING APPARATUS

CROSS REFERENCE TO RELATED APPLICATION

The present application claims priorities from Japanese Patent Application Nos. 2010-016974 and 2010-016975 both filed on Jan. 28, 2010, the disclosures of which are incorporated herein by reference in their entirety.

BACKGROUND OF THE INVENTION

1. Field of the Invention

The present invention relates to a wiring connection structure of driver IC including a driver IC and wires connected to the driver IC, and a liquid droplet jetting apparatus.

2. Description of the Related Art

In the ink-jet head of a printer described in Japanese Patent Application Laid-Open No. 2007-83707, an FPC (Flexible Printed Circuit) is arranged on the upper surface of a piezoelectric actuator. On the surface of the FPC, a driver IC (driver IC chip) is installed and, at the same time, there are formed input-wires laid out from the driver IC toward the opposite side of the piezoelectric actuator, and output-wires laid out from the driver IC toward the piezoelectric actuator. Further, by connecting an FFC (Flexible Flat Cable) to an end portion of the FPC on the side opposite to the piezoelectric actuator, the input-wires are connected to the wires on the FFC.

Here, the input-wires include a wire connecting the driver IC to a power supply, wires for transmitting the signal of recording data and the clock signal to the driver IC, etc., whereas the output-wires include wires for transmitting the drive signal for the piezoelectric actuator generated in the driver IC.

SUMMARY OF THE INVENTION

Here, with respect to the ink-jet printer, in order to realize a high-resolution printing and the like, it is conceivable to increase the number of nozzles. However, in such a case, it is also necessary to increase the number of the output-wires to correspond to the increased number of nozzles.

Nevertheless, in this case, because a great number of the output-wires and input-wires are arranged on a single FPC, the intervals between the input-wires and the output-wires become small. As a result, for example, signals at a comparatively low voltage, such as the signal of recording data, the clock signal and the like transmitted through the input-wires, may become susceptible to the influence of noise from the drive signal at a comparatively high voltage transmitted through the output-wires.

In view of the above problem, the present inventors conceived that the input-wires were not formed on the FPC, and the wires on the FFC were connected to the driver IC via bonding wires (by wire bonding).

However, according to the inventors' knowledge and perceptions, because magnetic flux is generated around the output wires due to the electric current flowing through the output wires, it is conceivable that the signal of recording data and the clock signal transmitted through the bonding wires are still likely to be affected by the magnetic flux.

Further, because it is necessary to arrange terminals, circuits, and the like as compactly as possible in the driver IC, the intervals between the input terminals of the driver IC connected to the bounding wires are narrower than the intervals between the connection terminals of the wires on the FFC connected to the bounding wires. Therefore, if the connection terminals of the wires on the FFC are connected to the input terminals of the driver IC via the bounding wires, variation may occur in the length of the bonding wires. Then, in such a case, at the time of inputting the signal of recording data corresponding to a plurality of nozzles to the driver IC, variation may occur in the timing of inputting the signal and, as a result, variation may occur in the timing of jetting ink from the nozzles.

Accordingly, an object of the present invention is to provide a wiring connection structure of driver IC through which signals are transmitted correctly to the driver IC, and a liquid droplet jetting apparatus.

According to a first aspect of the present invention, there is provided a wiring connection structure of driver IC including:

a first wiring substrate;

a driver IC which is installed on the first wiring substrate and which has a plurality of input terminals and a plurality of output terminals;

a plurality of output wires which are formed on the first wiring substrate and which are connected to the output terminals of the driver IC;

a plurality of input wires which have connection terminals to be connected to the input terminals of the driver IC, respectively, and which include a first signal input wire and a second signal input wire through which a first signal and a second signal that is more susceptible to an influence of noise than the first signal are transmitted, respectively; and a plurality of bonding wires which connect the input terminals of the driver IC to the connection terminals of the input wires, respectively, which have an identical length to each other, and which includes a first bonding wire having a first loop height from the first wiring substrate and a second bonding wire having a second loop height higher than the first loop height, wherein intervals between the input terminals are narrower than intervals between the connection terminals of the input wires, the first signal is transmitted through the first bonding wire, and the second signal is transmitted through the second bonding wire.

When the driver IC is connected to the plurality of input wires on the first wiring substrate, if there become a great number of the input and output wires, then the input and output wires are to be arranged densely on the first wiring substrate. Thereby, noise becomes more likely to occur in the signals transmitted through the input wires due to the drive signal transmitted through the output wires.

However, according to the present invention, because the plurality of input wires are connected to the driver IC by the plurality of bonding wires, it is possible to prevent noise from occurring in the signals transmitted through the input wires.

Further, because the plurality of bonding wires, which are connected to the signal input wires for transmitting the plurality of kinds of signals, mutually have an identical length, it is possible to prevent variation from occurring in the timing of inputting these plurality of kinds of signals from the signal input wires to the driver IC.

Further, even though the plurality of input wires are connected to the driver IC by the plurality of bonding wires, the signals transmitted through the bonding wires may still be affected by magnetic flux generated by the electric current flowing through the output wires. Thereby, the lower the loop of the bonding wire is, that is, the closer to the output wires the bonding wire is, the more likely it is to be affected by the magnetic flux, and thereby the noise becomes more likely to occur in the signal transmitted therethrough.

However, according to the present invention, because the bonding wire transmitting the signal more susceptible to the influence of noise has a higher loop, it is possible to restrain the noise as much as possible from occurring in the signals susceptible to the influence of noise. Further, in the present application, "signals susceptible to the influence of noise" refer to low-voltage signals at a lower voltage than that of the power-supply voltage signal inputted from the power supply (for example, waveform signals at a voltage equal to or lower than 50% of that of the power-supply voltage signal or, further, waveform signals at a voltage equal to or lower than 20% of that of the power-supply voltage signal), high-frequency signals such as the clock signal which will be described hereinafter, other high-frequency signals transmitted with a high frequency equivalent to or higher than that of the clock signal, etc.

According to a second aspect of the present invention, there is provided a liquid drop jet apparatus which jets a liquid droplet including:

a liquid droplet jetting head which is configured to jet the liquid droplet and in which a plurality of nozzles are founed, the nozzles being arranged to form a plurality of nozzle rows aligned along one direction;

a first wiring substrate which is connected to the liquid droplet jetting head;

a driver IC which is installed on the first wiring substrate, which drives the liquid droplet jetting head, and which has a plurality of input terminals and a plurality of output terminals;

a plurality of output wires which are formed on the first wiring substrate and which are connected to the output terminals of the driver IC;

a plurality of input wires which have connection terminals to be connected to the input terminals, respectively: and a plurality of bonding wires which connect the input terminals of the driver IC to the connection terminals of the plurality of input wires, respectively, wherein intervals between the input terminals of the driver IC are narrower than intervals between the connection terminals of the input wires, the input wires include a plurality of first jetting data signal input wires through which a first jetting data signal is transmitted and a plurality of second jetting data signal input wires through which a second jetting data signal is transmitted, the first jetting data signal indicating a timing of jetting the liquid droplet from the nozzles forming odd-numbered nozzle rows from one side of the one direction, and the second jetting data signal indicating another timing of jetting the liquid droplet from the nozzles forming even-numbered nozzle rows from the one side of the one direction, the plurality of bonding wires include a plurality of first wires which are connected to the connection terminals of the plurality of first jetting data signal input wires, and a plurality of second wires which are connected to the connection terminals of the plurality of second jetting data signal input wires, and the plurality of first wires mutually have an identical length, whereas the plurality of second wires mutually have another identical length.

When the liquid drop jet head has a plurality of nozzle rows, in order to prevent the so-called crosstalk, such a method may be utilized as to differentiate the timing of liquid droplet jetting from the plurality of nozzles forming the odd-numbered nozzle rows from the timing of liquid droplet jetting from the plurality of nozzles forming the even-numbered nozzle rows. According to the present invention, in such a case, it is possible to prevent the variation from occurring in the timing of inputting the jetting data signal of the liquid drops corresponding to the plurality of nozzles forming the odd-numbered nozzle rows to the driver IC, and in the timing of inputting the jetting data signal of the liquid drops corresponding to the plurality of nozzles forming the even-numbered nozzle rows to the driver IC, respectively.

According to a third aspect of the present invention, there is provided a wiring connection structure of driver IC including:

a first wiring substrate;

a driver IC which is installed on the first wiring substrate and which has a plurality of input terminals and a plurality of output terminals;

a plurality of output wires which are formed on the first wiring substrate and which are connected to the output terminals of the driver IC;

a plurality of input wires which have connection terminals to be connected to the input terminals, respectively; and a plurality of bonding wires which connect the input terminals of the driver IC to the connection terminals of the input wires, wherein intervals between the input terminals are narrower than intervals between the connection terminals of the input wires, and the bonding wires have an identical loop height from the first wiring substrate to each other.

When the driver IC is connected to the plurality of input wires on the first wiring substrate, if there become a great number of the input and output wires, then the input and output wires are to be arranged densely on the first wiring substrate. Thereby, noise becomes more likely to occur in the signals transmitted through the input wires due to the drive signal (electric current) transmitted through the output wires.

However, according to the present invention, because the plurality of input wires are connected to the driver IC by the plurality of bonding wires, it is possible to prevent noise from occurring in the signals transmitted through the input wires.

Further, the signals transmitted through the bonding wires may be affected by magnetic flux generated by the electric current flowing through the output wires. Thereby, the lower the loop of the bonding wire is, that is, the closer to the output wires the bonding wire is, the more likely it is to be affected by the magnetic flux, and thereby the noise becomes more likely to occur in the signal transmitted therethrough. As a result, if there is any variation in the loop height of the plurality of bonding wires, it is possible to give rise to the occurrence of variation in the noise which occurs in the signals and the like inputted to the driver IC through the bonding wires.

However, according to the present invention, because the plurality of bonding wires mutually have an identical loop height, it is possible to prevent the variation from happening in the noise which occurs in the signals transmitted through the respective bonding wires.

BRIEF DESCRIPTION OF THE DRAWINGS

FIG. 10A is a partial enlarged view of the COF and the FPC of FIG. 9 in the vicinity of a driver IC, indicating a state with a heat sink and a molded resin being arranged;

FIG. 10B is another partial enlarged view of the COF and the FPC of FIG. 9 in the vicinity of a driver IC, indicating a state without the heat sink and molded resin;

DESCRIPTION OF THE PREFERRED EMBODIMENTS

First Embodiment

Hereinbelow, explanations will be made with respect to a first preferred embodiment of the present teaching.

Figure 1:
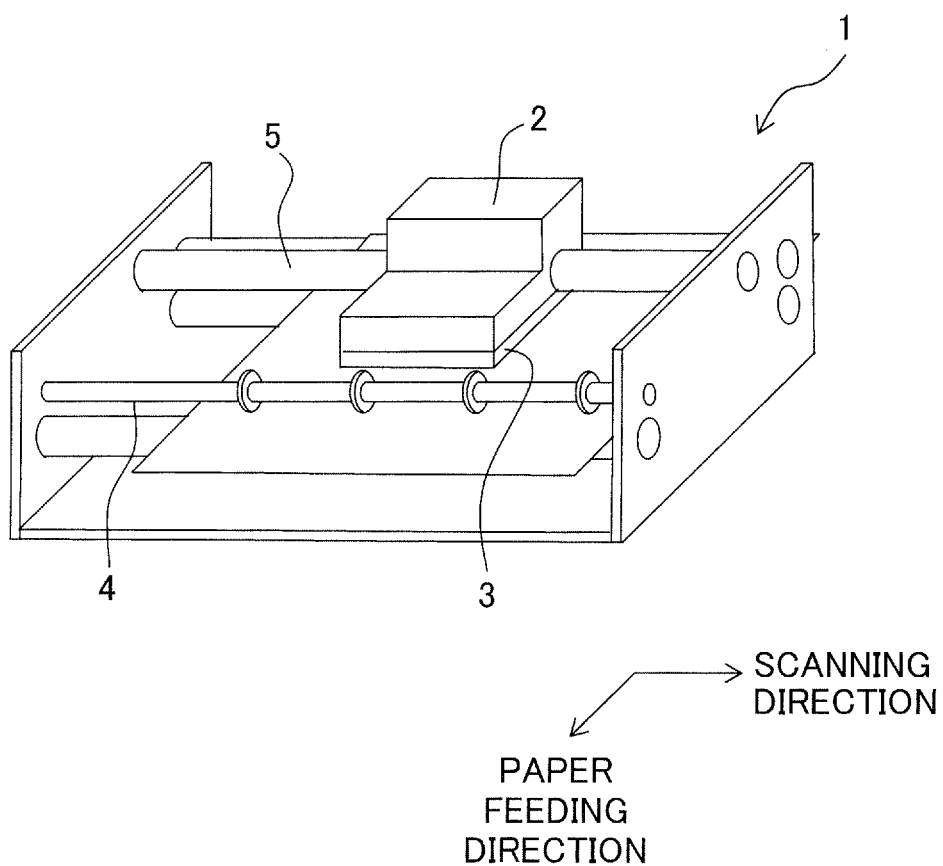
FIG. 1 is a schematic configuration diagram of a printer in relation to a first embodiment of the present invention.

As shown in FIG. 1, a printer 1 includes a carriage 2, an ink-jet head 3 (liquid droplet jetting head), a paper transport roller 4, and the like.

The carriage 2 moves in a reciprocating manner along a guide shaft 5 in a scanning direction (a left-right direction in FIG. 1). The ink-jet head 3 is installed on the lower surface of the carriage 2, and jets ink drops from a plurality of nozzles 15 (see FIG. 2) formed in the lower surface of the ink-jet head 3. The paper transport roller 4 transports a recording paper P in a paper feeding direction (a frontward direction in FIG. 1).

Then, the printer 1 carries out a printing on the recording paper P by jetting ink drops from the ink-jet head 3 moving in a reciprocating manner in the scanning direction together with the carriage 2 to the recording paper P transported by the paper transport roller 4 in the paper feeding direction.

Figure 2:
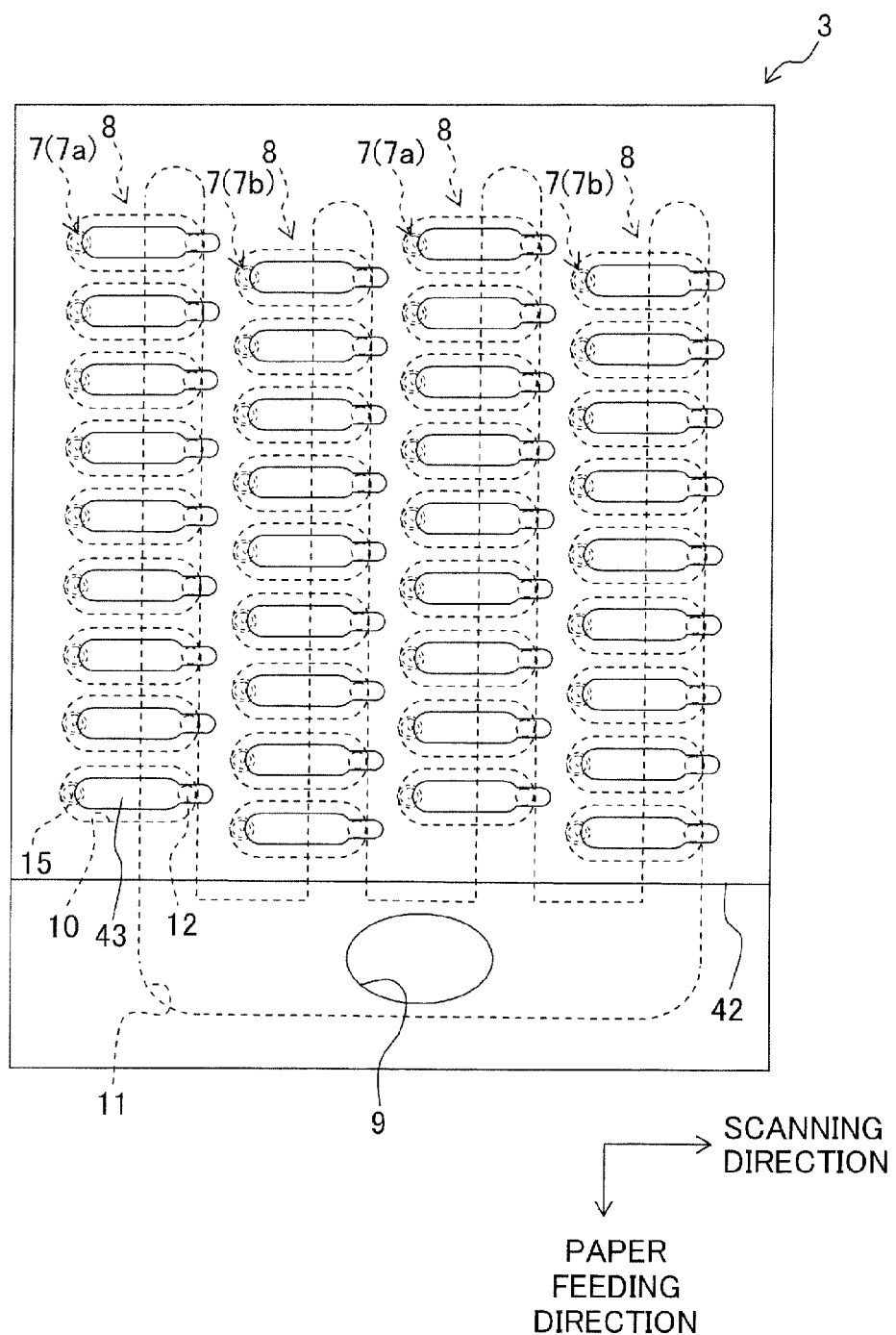
FIG. 2 is a plan view of an ink-jet head of the printer of FIG. 1.
Figure 3:
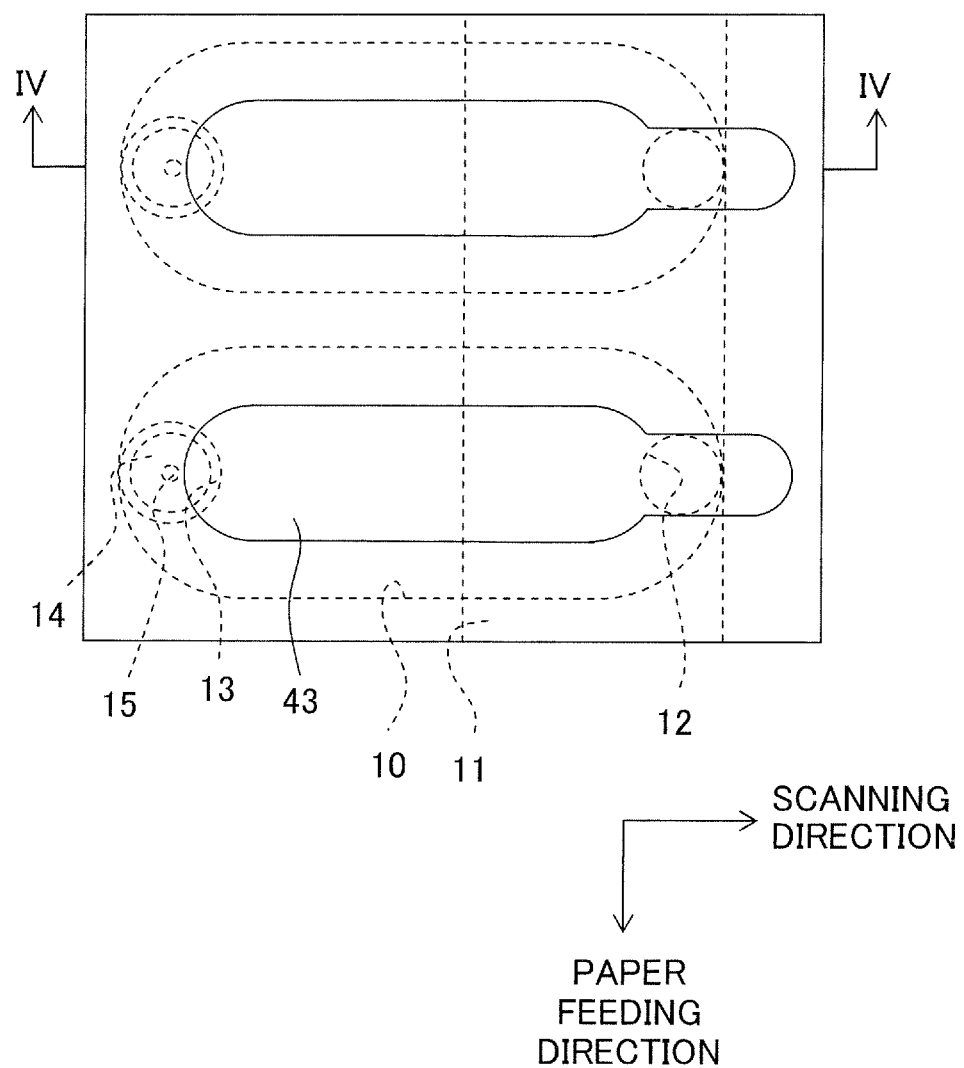
FIG. 3 is a partial enlarged view of FIG. 2.
Figure 4:
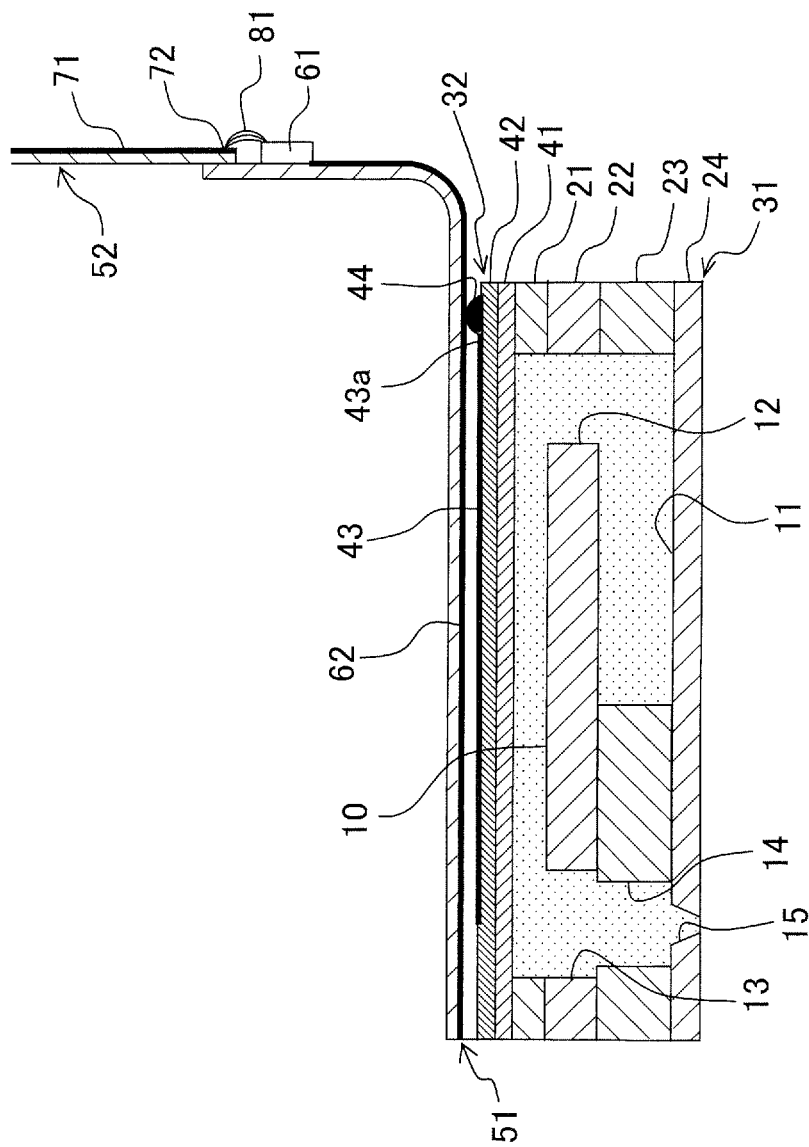
FIG. 4 is a cross-sectional view taken along the line IV-IV of FIG. 3.

Next, the ink-jet head 3 will be described. As shown in FIGS. 2 to 4, the ink-jet head 3 has a channel unit 31 in which ink channels are formed such as pressure chambers 10, the nozzles 15 and the like which will be described below, and a piezoelectric actuator 32 which is arranged on the upper surface of the channel unit 31.

The channel unit 31 is formed by stacking each other a cavity plate 21, a base plate 22, a manifold plate 23, and a nozzle plate 24. Here, among the four plates 21 to 24, except the nozzle plate 24, the three plates 21 to 23 are formed of a metallic material such as stainless steels and the like, whereas the nozzle plate 24 is formed of a synthetic resin material such as polyimide and the like. Alternatively, the nozzle plate 24 may also be formed of a metallic material similar to the other three plates 21 to 23.

The plurality of pressure chambers 10 are formed in the cavity plate 21. Each of the pressure chambers 10 has an approximate ellipse shape, in a plane view, of which longitudinal direction coincides with the scanning direction (the left-right direction in FIG. 2). Further, the pressure chambers 10 are aligned in the paper feeding direction to form pressure chamber rows 8. In this manner, four pressure chamber rows 8 are arranged side by side in the scanning direction. Through holes 12 and 13 of which openings are formed to be approximate-circle-shaped are formed in the base plate 22 at the areas corresponding to the two end portions of each of the pressure chambers 10 in the longitudinal direction.

A manifold channel 11 is formed in the manifold plate 23. The portions, of the manifold channel 11, which overlap with the approximate right halves of the plurality of pressure chambers 10 forming the pressure chamber rows 8 extend in the paper feeding direction. Further the portions, of the manifold channel 11, extending in the paper feeding direction are connected with each other at the lower end portion of the manifold channel 11 as shown in FIG. 2. Further, ink is supplied to the manifold channel 11 from an ink supply port 9 provided in the lower end portion of the manifold channel 11. Further, through holes 14 of which openings are formed to be approximate-circle-shaped are formed in the manifold plate 23, at the areas which overlap with the through holes 13, respectively.

The nozzles 15 are formed in the nozzle plate 24 at the areas which overlap with the through holes 14, respectively. These nozzles 15 are aligned in the paper feeding direction to form nozzle rows 7, in the same manner as the pressure chambers 10. In this manner, four nozzle rows 7 are arranged side by side in the scanning direction.

Then, in the channel unit 31, the manifold channel 11 is in communication with the pressure chambers 10 via the through holes 12 and, further, the pressure chambers 10 are in communication with the nozzles 15 via the through holes 13 and 14. In this manner, in the channel unit 31, a plurality of individual ink channels are formed each of which extends from one of the exits of the manifold channel 11 through one of the pressure chambers 10 to one of the nozzles 15.

The piezoelectric actuator 32 includes a vibration plate 41, a piezoelectric layer 42, a plurality of individual electrodes 43, and the like. The vibration plate 41 is formed of a metallic material such as stainless steels and the like, and is joined to the upper surface of the cavity plate 21 so as to cover the pressure chambers 10.

The piezoelectric layer 42 is made of a piezoelectric material composed mainly of lead zirconate titanate which is a mixed crystal of lead titanate and lead zirconate. The piezoelectric layer 42 is formed to cover the pressure chambers 10 continuously on the upper surface of the vibration plate 41. Further, the portions of the piezoelectric layer 42 each of which overlaps with one of the pressure chambers 10 is polarized in the thickness direction of the piezoelectric layer 42.

The plurality of individual electrodes 43 are formed on the upper surface of the piezoelectric layer 42 to correspond to the pressure chambers 10, respectively. Each of the individual electrodes 43 has an approximate ellipse shape which is one size smaller than the pressure chambers 10 in a plane view, and is arranged to overlap with the approximately central portion of one of the pressure chambers 10, respectively. Further, as shown in FIG. 2, the right-end portions of the individual electrodes 43 extend on to the portions which no longer overlap with the pressure chambers 10, and the tips of the right-end portions form connection terminals 43a. The lands 44 are formed on the upper surface of the connection terminals 43a, and output wires 62 of a COF (Chip On Film)

51 (a first wiring substrate), which will be described hereinafter, are connected to the lands 44. By virtue of this, the individual electrodes 43 are connected to a driver IC 61 via the output wires 62 as will be described hereinafter. Thus, a drive voltage (drive signal) is applied to the individual electrodes 43 from the driver IC 61 via the output wires 62 and the lands 44.

Further, the conductive vibration plate 41 is connected to surface electrodes (not shown) formed on the upper surface of the piezoelectric layer 42 via conductive materials arranged in through holes (not shown) formed in the piezoelectric layer 42. These surface electrodes are further connected to the driver IC 61 via lands (not shown) formed on the upper surface of the surface electrodes and via the output wires 62 formed on the COF 51. Further, the vibration plate 41 is constantly maintained at the ground potential by the driver IC 61, and also serves as a common electrode at the time of driving the piezoelectric actuator 32.

Hereinbelow, prior to explaining the COF 51, descriptions will be made first with respect to a method of driving the piezoelectric actuator 32. The plurality of individual electrodes 43 of the piezoelectric actuator 32 are maintained in advance at the ground potential. Then, when the driver IC 61 applies the drive potential (drive voltage) to any one of the individual electrodes 43, a potential difference occurs in the portion of the piezoelectric layer 42 sandwiched between this individual electrode 43 and the vibration plate 41 as the common electrode, and thereby an electrical field is produced in this portion of the piezoelectric layer 42 in the thickness direction by this potential difference. Since the direction of the electrical field coincides with the polarization direction of the piezoelectric layer 42, this portion of the piezoelectric layer 42 contracts in a horizontal direction which is perpendicular to the polarization direction. By virtue of this, the portion of the vibration plate 41 and the piezoelectric layer 42 which overlap with the pressure chamber 10 deforms as a whole to be convex toward the pressure chamber 10. This deformation decreases the volume of the pressure chamber 10 and thus increases the pressure on the ink inside the pressure chamber 10. This increased pressure on the ink causes ink drops to be jetted from the nozzle 15 in communication with the pressure chamber 10.

Next, explanations will be made with respect to the COF 51, and an FPC (Flexible Printed Circuit) 52 (a second wiring substrate) which is connected with the COF 51, referring to FIGS. 4 to 6A. Further, in FIG. 6A, some output terminals 64 arranged at the positions which overlap with input terminals 63 are omitted in order to make it easy to see.

As shown in FIGS. 4 to 6A, the COF 51 is arranged over the piezoelectric actuator 32. The portion of the COF 51 which overlaps with the piezoelectric actuator 32 extends in a horizontal direction, while one end portion of the COF 51 which does not overlap the piezoelectric actuator 32 bends to extend upward. Further, the upper end portion of the COF 51 extending upward is connected with one end portion of the FPC 52. Further, the other end portion of the FPC 52 is connected to a control device on a main substrate (not shown).

The driver IC 61 is installed on the COF 51, and the plurality of output wires 62 are formed on the COF 51. The driver IC 61 has an approximately rectanglar shape in a plane view, and is installed on the surface of the end portion of the COF 51 extending upward on the right side of FIG. 4. The driver IC 61 is arranged on the end portion of the COF 51 such that the longitudinal direction of the driver IC 61 coincides with the left-right direction in FIG. 6A. Further, on the surface of the driver IC 61 across from the COF 51 (to be referred to as the upper surface of the driver IC 61, hereinafter), the plurality of input terminals 63 are provided to align approximately at regular intervals in the left-right direction in FIG. 6A. Further, the plurality of output terminals 64a and 64b are provided, on the surface of the driver IC 61 next to the COF 51 (to be referred to as the lower surface of the driver IC 61, hereinafter), at the upper and lower end portions, respectively. The output terminals 64a and 65b are arranged to align approximately at regular intervals in the left-right direction in FIG. 6A.

Here, the plurality of input terminals 63 are provided to supply electric power, input signals, etc., to the driver IC 61 from the main substrate (not shown). The plurality of output terminals 64a and 64b are provided to output the drive signal to drive the piezoelectric actuator 32, etc., from the driver IC 61.

Further, a logic circuit 65 and drive signal output circuits 66 are formed in the driver IC 61. The logic circuit 65 is formed in an approximately central portion of the driver IC 61 for processing a jetting data signal, a drive waveform signal and the like. The jetting data signal indicates the timing of the ink-jetting from each of the nozzles 15, and the drive waveform signal corresponds to the drive signal. These signals are inputted from the input terminals 63.

Figure 6A:
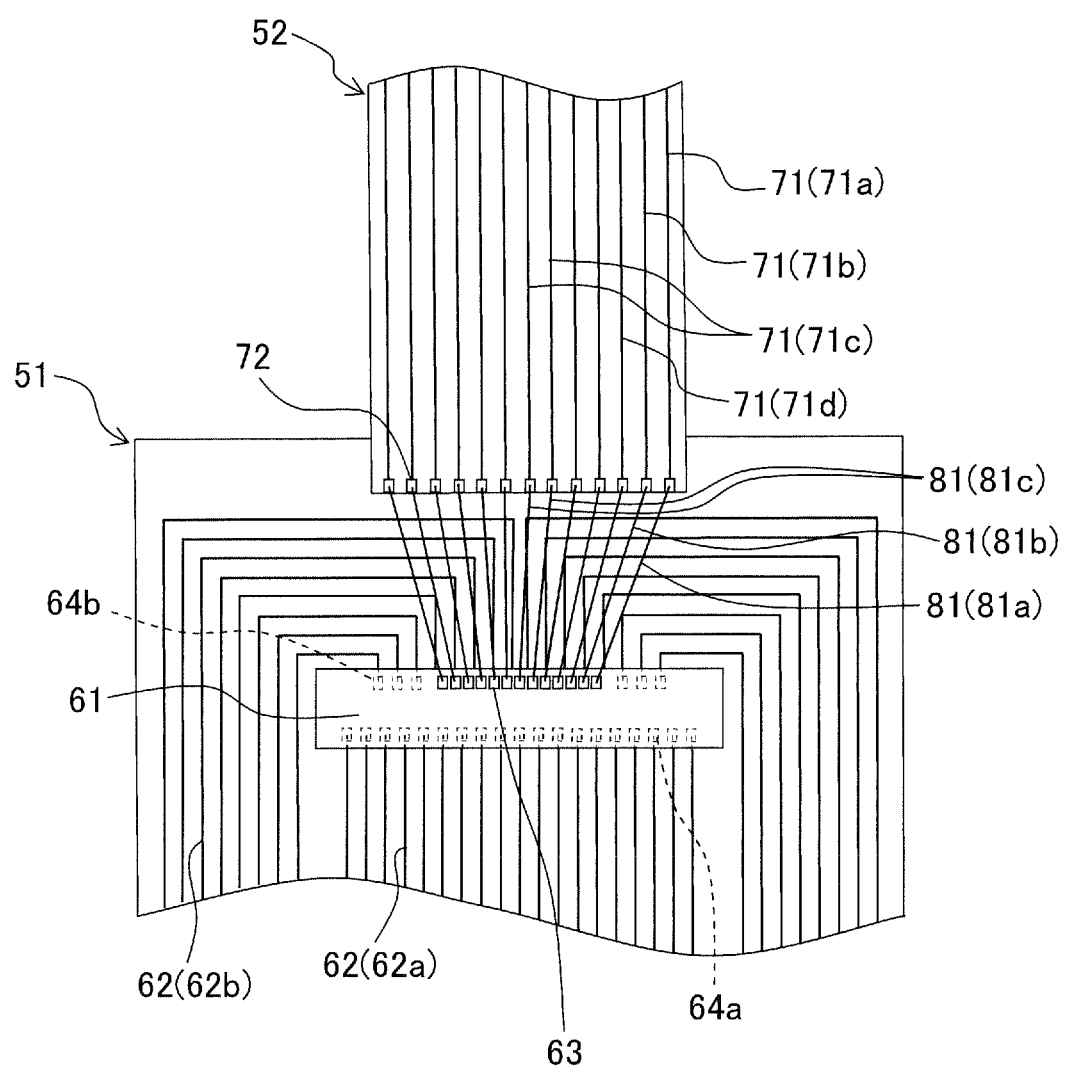
FIG. 6A is a side view observing FIG. 5 from a direction indicated by the arrow mark VI.

In the driver IC 61, the drive signal output circuits 66 are arranged at the both sides of the logic circuit 65 in the left-right direction in FIG. 6A. The drive signal output circuits outputs the drive signal from the output terminals 64a and 64b based on the processing result from the logic circuit 65.

The plurality of output wires 62 are provided to correspond to the plurality of nozzles 15 and connected to the output terminals 64a and 64b of the driver IC 61. Further, among the output wires 62, the output wires 62a connected to the output terminals 64a extend from the output terminals 64a toward the under side in FIG. 6A, and further extend along the extending direction of the COF 51 up to the portions which overlap the corresponding lands 44. On the other hand, the output wires 62b connected to the output terminals 64b extend from the output terminals 64h toward the upper side in FIG. 6A, then turn approximately 180 degrees, and extend thereafter along the extending direction of the COF 51 so as to avoid colliding with the driver IC 61, up to the portions which overlap the corresponding lands 44.

Here, according to the printer 1 of the first embodiment, in order to realize a high-resolution printing, for example, the plurality of nozzles 15 are formed in the ink jet head 3. Further, because the output wires 62a and 62b are laid out from both sides of the driver IC 61, that is, from one side facing the piezoelectric actuator 32 (the lower side of FIG. 6A) and the other side not facing the piezoelectric actuator 32 (the upper side of FIG. 6A), it is possible to form the output wires 62 on the COF 51 to correspond to the plurality of nozzles 15.

Then, as described hereinabove, the driver IC 61 applies the drive potential to the respective individual electrodes 43 and, at the same time, maintains the vibration plate 41 as the common electrode at the ground potential via the output wires 62 and the lands 44.

A plurality of input wires 71 are formed on the FPC 52. The plurality of input wires 71 extend in the extending direction of the FPC 52 (the up-down direction of FIG. 6A) over the entire length of the FPC 52. The input wires 71 align approximately at regular intervals in the left-right direction in FIG. 6A. Further, the connection terminals 72 are provided at the lower end portions of the input wires 71, respectively, as shown in FIG. 6A.

Then, the connection terminals 72 of the input wires 71 are connected to the input terminals 63 of the driver IC 61, respectively, via a plurality of bonding wires 81 extending to cross over or step over the output wires 62b on the COF 51. The plurality of bonding wires 81 are made of a conductive material such as gold and the like. Two end portions of each of the bonding wires 81 are pressed against the input terminals 63 and against the connection terminals 72, respectively. These two end portions are joined to one of the input terminals 63 and one of the connection terminals 72 by radiating ultrasound waves to the pressed portions. All of the bonding wires 81 have an identical length.

Here, the driver IC 61 is subject to a strict limitation on the space for arranging the input terminals 63 for the purpose of high integration. On the other hand, the FPC 52 has more room in space in comparison with the driver IC 61, and thereby the intervals between the connection terminals 72 are wider than those between the input terminals 63. Therefore, the direct distance between the input terminal 63 and the connection terminal 72 becomes shorter toward the inner side of the input terminal 63 and the connection terminal 72 in the left-right direction in FIG. 6A.

Figure 5:
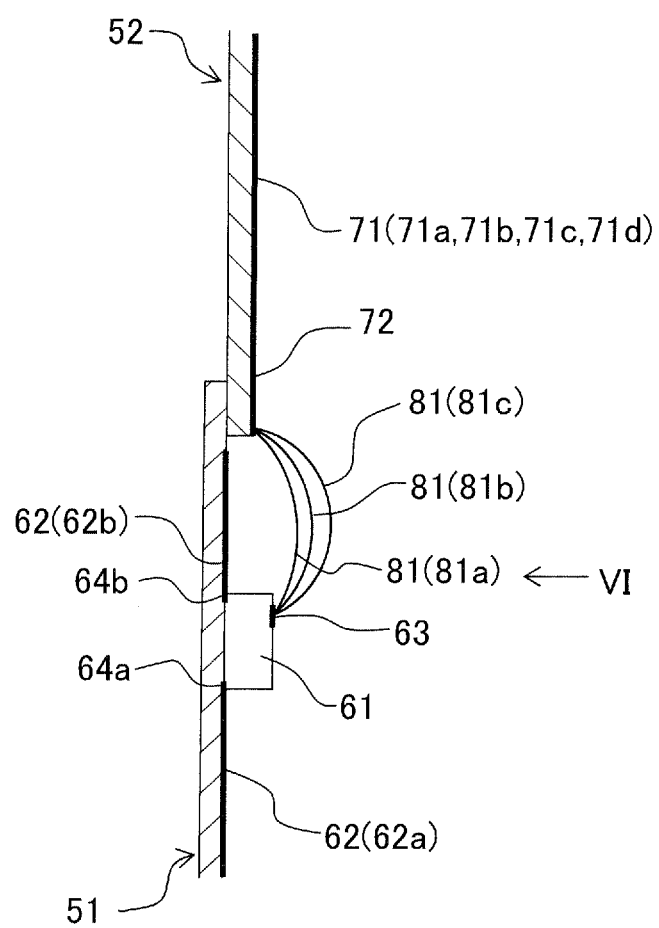
FIG. 5 is a partial enlarged view of FIG. 4.

Therefore, as shown in FIG. 5, the plurality of bonding wires 81 with the identical length are different in the loop height from each other. That is, the loop becomes higher with respect to the bonding wire 81 connecting the more inward input terminal 63 and connection terminal 72 in the left-right direction of FIG. 6A with a shorter straight-line distance.

Further, the plurality of input wires 71 include a power input wire 71a connected to a power supply provided on the main substrate (not shown), a drive waveform signal input wire 71b for inputting the drive waveform signal to the driver IC 61, a plurality of data signal input wires 71c for inputting the jetting data signal for ink-jetting from the nozzles 15 to the driver IC 61, and a clock input wire 71d for inputting a clock signal. Further, in the first embodiment, the drive waveform signal input wire 71b data signal input wires 71c and the clock input wire 71d correspond to the signal input wires of the present teaching.

Here, the drive waveform signal is a waveform signal corresponding to the drive signal to be outputted from the output terminal 64. The drive signal which is generated by being amplified the drive waveform signal by using the power-supply voltage is outputted from the output terminal 64 as the drive signal.

Further, the jetting data signal indicates the timing of ink jetting from the nozzles 15, and the drive signal is outputted from the output terminals 64 of the driver IC 61 according to the timing indicated by the jetting data signal. At the time, in order to allow a number of ink drops different in volume to be jetted from the nozzles 15, for example, if there are a number of different kinds of the drive waveform signals, the jetting data signal indicates not only the timing of ink jet from the nozzles 15 but also the information for selecting the drive waveform signals. Further, the clock signal is a signal which serves as a standard of the timing for the driver IC 61 to drive.

Then, the drive waveform signal input wire 71b is arranged to be more inward than the power input wire 71a. The data signal input wires 71c and the clock input wire 71d are arranged to be still more inward than the drive waveform signal input wire 71b.

By virtue of this, the power input wire 71a is connected to the bonding wire 81a with a lower loop, the drive waveform signal input wire 71b is connected to the bonding wire 81b with a higher loop than the loop with the bonding wire 81a, and the data signal input wires 71c and the clock input wire 71d are connected to the bonding wires 81c with still higher loops than the loop with the bonding wire 81b.

Then, as described hereinbefore, the drive potential is applied to the individual electrodes 43 to drive the piezoelectric actuator 32 via the drive signal outputted from the driver IC 61 (output terminals 64a and 64b), and thereby ink drops are jetted from the nozzles 15.

Further, in a different manner from the first embodiment, here it is also conceivable to provide the input terminals 63 on the lower surface of the driver IC 61 so that the plurality of input wires 71 are connected to the input terminals 63 via wires formed on the COF 51.

However, in such a case, because the output wires 62b are arranged between the driver IC 61 and the connecting portion of the COF 51 which is connected to the FPC 52, the output wires 62b and the wires for connecting the input wires 71 to the input terminals 63 are arranged at positions close to each other. Therefore, due to the influence of the drive signal transmitted through the output wires 62b, it is possible to give rise to the occurrence of noise in the signals and the like transmitted through the input wires 71 to be inputted to the driver IC 61.

Because the power-supply voltage inputted to the driver IC 61 is at a similar level to the voltage of the drive signal transmitted through the output wires 62 (approximately 20 V, for example), the influence of the noise may not become considerably great. On the other hand, because the drive waveform signal, the jetting data signal, the clock signal, and the like are signals at a lower voltage (approximately 3.3 V, for example) than the power-supply voltage, they are susceptible to the influence of the noise.

Further, if the noise occurs in the drive waveform signal, there is a fear that some distortion and the like may occur in the corresponding drive signal outputted from the output terminals 64. However, since this should not result in a failure of outputting the drive signal per se, the print quality is unlikely to decrease significantly.

On the contrary, if the noise occurs in the jetting data signal indicating the timing of ink-jetting, or in the clock signal serving as a standard of the timing for the driver IC 61 to drive, a number of problems may happen such as ink drops are not jetted from the nozzle 15 according to the timing for the ink drops to be jetted; on the contrary, ink drops are jetted off the timing for the ink drops to be jetted; the piezoelectric actuator 32 is driven by a drive signal which corresponds to a drive waveform signal different from the drive waveform signal which should have been selected; etc. If these problems happen, the print quality is subject to a significant decrease.

In view of the above factors, in the first embodiment, signals such as the drive waveform signal, the jetting data signal, the clock signal, and the like are more susceptible to the influence of the noise in comparison with the power-supply voltage. Further, the jetting data signal and the clock signal can be regarded as especially susceptible to the influence of the noise.

Further, in the above case, the connection terminals 72 of the input wires 71 on the FPC 52 are connected to the connection terminals of the wires connected to the input terminals 63 on the COF 51 at the connecting portions provided on the COF 51 and FPC 52, respectively. In other words, these connection terminals on the wiring substrates different from each other are directly connected at the connection portions provided on those wiring substrates. Therefore, impedance increases significantly in the connecting portions connecting those connection terminals and, as a result, this increase of impedance gives rise to a considerable voltage drop of the signals inputted to the driver IC 61. Especially, because the drive waveform signal, the jetting data signal, the clock signal, and the like are at a low voltage, such kind of voltage drop may become a serious problem.

In order to solve this problem, in the first embodiment, the connection terminals 72 of the input wires 71 on the FPC 52 are connected to the input terminals 63 of the driver IC 61 by the bonding wires 81 isolated from the output wires 62. Therefore, the drive signal transmitted through the output wires 62 can hardly cause a noise to occur in the jetting data signal and the clock signal transmitted through the input wires 71 to be inputted to the driver IC 61. Further, because there is not any portion which may cause an impedance increase as described hereinabove between the input wires 71 and the input terminals 63, the signals transmitted through the input wires 71 are hardly attenuated.

Further, because all of the plurality of bonding wires 81 have the identical length, variation is prevented from occurring in the timing of inputting the drive waveform signal, the jetting data signal, the clock signal and the like to the driver IC 61 via the bonding wires 81 so that variation is prevented from occurring in the timing of ink-jetting from the plurality of nozzles 15.

Further, because all of the plurality of bonding wires 81 have an identical length, it is possible to utilize one kind of wires identical in length to form all of the bonding wires 81.

However, even though the connection terminals 72 are connected to the input terminals 63 by the bonding wires 81, it is still possible to give rise to the occurrence of noise in the signals and the like transmitted through the bonding wires 81 due to the influence of magnetic flux generated by the electric current flowing through the output wires 62 at the time of transmitting the drive signal. Further, the lower the loop of the bonding wire 81 is, that is, the closer to the output wires 62 the bonding wire 81 is, the greater the influence of the magnetic flux becomes, and thereby the noise becomes more likely to occur.

In order to solve the above problem, in the first embodiment, as described hereinabove, the bonding wire 81a with a lower loop is connected to the power input wire 71a through which the power-supply voltage, which is less susceptible to the influence of noise, is inputted, and the bonding wire 81b with a higher loop than the loop with the bonding wire 81a is connected to the drive waveform signal input wire 71b through which the drive waveform signal, which is more susceptible to the influence of noise than the power-supply voltage, is transmitted. Further, the bonding wires 81c with still higher loops than the loop with the bonding wire 81b are connected to the data signal input wires 71c and the clock input wire 71d through which the jetting data signal and the clock signal which are more susceptible to the influence of noise than the drive waveform signal, are transmitted.

Then, by virtue of this, it is possible to restrain the noise as much as possible from occurring in the signals susceptible to the influence of noise due to the magnetic flux generated by the electric current flowing through the output wires 62.

Second Embodiment

Next, explanations will be made with respect to a second embodiment of the present teaching. It should be appreciated that the constitutive parts or components, which are the same as or equivalent to those of the first embodiment, are designated by the same reference numerals, any explanation of which will be omitted as appropriate.

Figure 7:
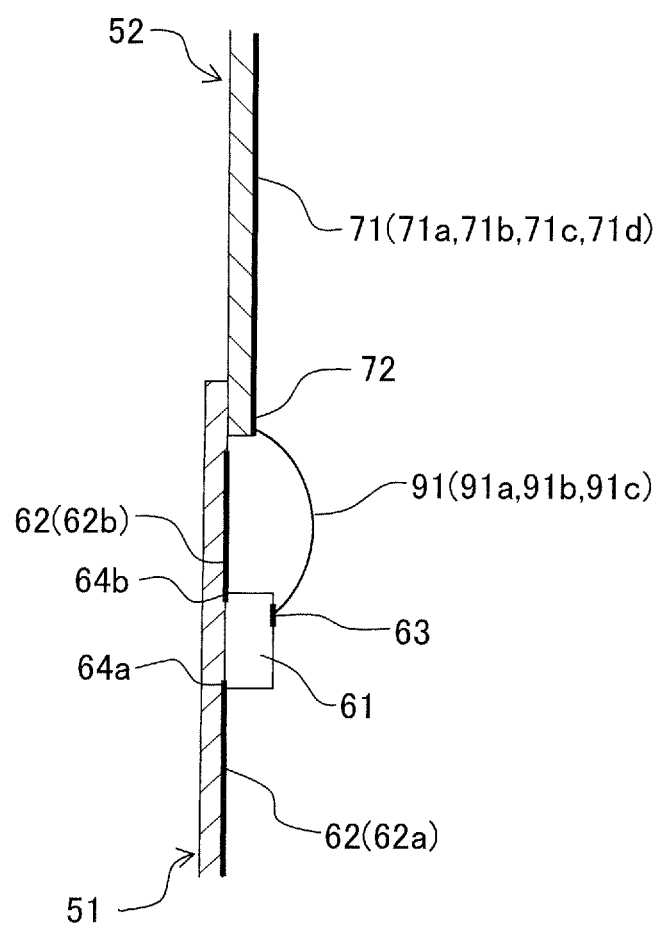
FIG. 7 is a partial enlarged view corresponding to FIG. 5 in accordance with a second embodiment of the present invention.
Figure 8:
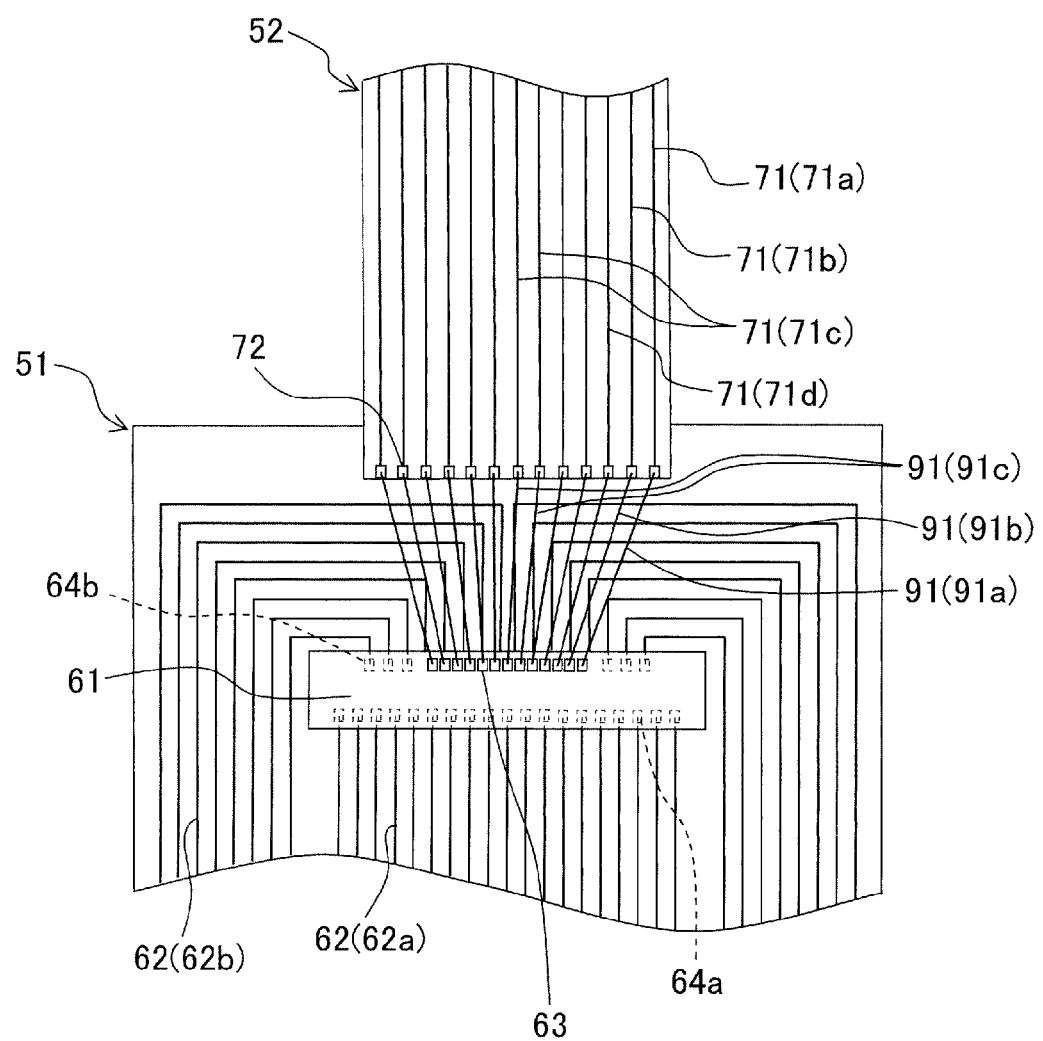
FIG. 8 is a side view corresponding to FIG. 6A in accordance with the second embodiment.

As shown in FIGS. 7 and 8, in the second embodiment, a plurality of bonding wires 91 all have an identical loop height. However, in this case, the intervals between the input terminals 63 of the driver IC 61 are narrower than the intervals between the connection terminals 72 of the FPC 52, as described hereinbefore. Therefore, the plurality of bonding wires 91 have a different length from each other, and the more inwardly the bonding wire 91 is located in the left-right direction in FIG. 8, the shorter the length of the bonding wire 91 becomes.

In the second embodiment, as shown in FIG. 8, the drive waveform signal input wire 71b is arranged to be more inward than the power input wire 71a in the left-right direction in FIG. 8 and, at the same time, the data signal input wires 71c and the clock input wire 71d are arranged to be still more inward than the drive waveform signal input wire 71b in the left-right direction in FIG. 8.

By virtue of this, the drive waveform signal input wire 71b is connected to the bonding wire 91b which is shorter than the bonding wire 91a connected to the power input wire 71a, and the data signal input wires 71c and the clock input wire 71d are connected to the bonding wires 91c which are still shorter than the bonding wire 91b.

In the above case, in the same manner as the first embodiment, the connection terminals 72 of the input wires 71 on the FPC 52 are connected to the input terminals 63 of the driver IC 61 by the bonding wires 91 isolated from the output wires 62. Therefore, the drive signal transmitted through the output wires 62 can hardly cause a noise in the jetting data signal and the clock signal which are transmitted through the input wires 71 and are inputted to the driver IC 61. Further, there is not any portion which may cause an impedance increase as described hereinbefore between the input wires 71 and the input terminals 63. Therefoer, the signals and the like transmitted through the input wires 71 are unlikely to be attenuated.

Further, as described hereinbefore, even though the connection terminals 72 are connected to the input terminals 63 by the bonding wires 91, it is still possible to give rise to the occurrence of noise in the signals and the like transmitted through the bonding wires 91 due to the influence of magnetic flux generated by the electric current flowing through the output wires 62 at the time of transmitting the drive signal. In this case, the lower the loop of the bonding wire 91 is, the greater the influence of the magnetic flux becomes to let the noise occur easily. As a result, if there is any variation in the loop height of the bonding wires 91, it is possible to give rise to the occurrence of variation in the noise which is caused in the signals and the like transmitted through the bonding wires 91.

However, in the second embodiment, because all of the bonding wires 91 have the identical loop height, it is possible to prevent the variation of the noise which is caused in the signals and the like inputted to the driver IC 61 through the respective bonding wires 91.

Further, in this manner, if all of the bonding wires 91 have an identical loop height, there may become a small variation in the noise which is caused in the signals inputted to the driver IC 61 through the respective bonding wires 91. However, because the bonding wires 91 are different in length, there is still a little variation in the noise which is caused in the signals transmitted therethrough. In this case, the longer the bonding wire 91 is, the higher the noise level is likely to become.

In the second embodiment, as described hereinabove, the shorter bonding wire 91 arranged more inwardly is connected to the input wire 71 through which the signal more susceptible to the influence of noise is transmitted. By virtue of this, it is possible to reduce the noise in the signals susceptible to the influence of noise as much as possible.

Third Embodiment

Next, explanations will be made with respect to a third embodiment of the present teaching. However, it should be appreciated that the constitutive parts or components, which are the same as or equivalent to those of the first and second embodiments, are designated by the same reference numerals, any explanation of which will be omitted as appropriate. Hereinbelow, explanations will be made with respect to the COF 51, and the FPC (Flexible Printed Circuit) 52 which is connected with the COF 51 in accordance with the third embodiment, referring to FIGS. 9 to 12. Further, the output terminals 64 arranged at the positions which overlap with the input terminals 63 are omitted to show in FIGS. 11A and 11B in order to make it easy to see. Further, FIG. 11A only shows an outer shape of a molded resin 96, which will be described hereinafter, with the dashed-two dotted line.

Figure 9:
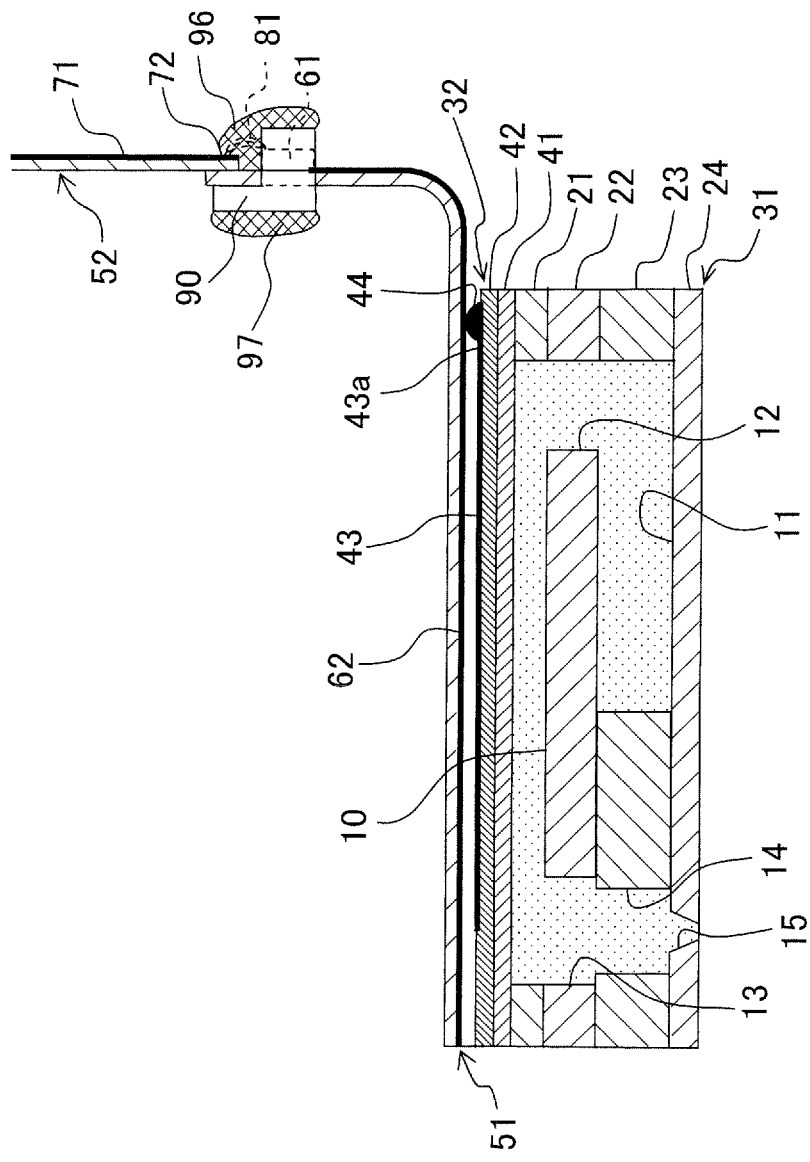
FIG. 9 is a cross-sectional view of a COF and an FPC in accordance with a third embodiment of the present invention.

A driver IC 61 is installed on the COF 51, and at the same time, a plurality of output wires 62 are formed on the COF 51. The driver IC 61 has a shape of an approximate rectangle in a plane view, and is installed on the right-side surface of the COF 51, at the extending portion extending upward, as shown in FIG. 9. The driver IC 61 is arranged such that the longitudinal direction of the driver IC 61 is substantially parallel to the left-right direction in FIGS. 11A and 11B. Further, the COF 51 is in contact with radiator pads 68 provided on the lower surface of the driver IC 61 in FIG. 12 (i.e., the surface facing the COF 51, to be simply referred to as the lower surface of the driver IC 61).

In the third embodiment, the power signal for activating the driver IC 61 and signals for controlling the operation of the driver IC 61 such as the jetting data signal and drive waveform signal are inputted from a control device on the main substrate (not shown) to the input terminals 63 of the driver IC 61 via the input wires 71 and the bonding wires 81.

Further, a heat sink 90 is provided on the driver IC 61 to release the heat generated in the driver IC 61. The heat sink 90 has first heat-radiating portions 91a and 91b, a second heat-radiating portion 92, and a connection portion 93.

Further, in the third embodiment, the first heat-radiating portions 91a and 91b correspond to a first heat radiating member in accordance with the present teaching; the second heat-radiating portion 92 corresponds to a second heat radiating member in accordance with the present teaching; and the heat sink 90 is, as will be described hereinafter, a single-piece member formed by the first heat-radiating portions 91a and 91b as the first heat radiating member and the second heat-radiating portion 92 as the second heat radiating member being connected together with the connection portion 93.

Figure 11A:
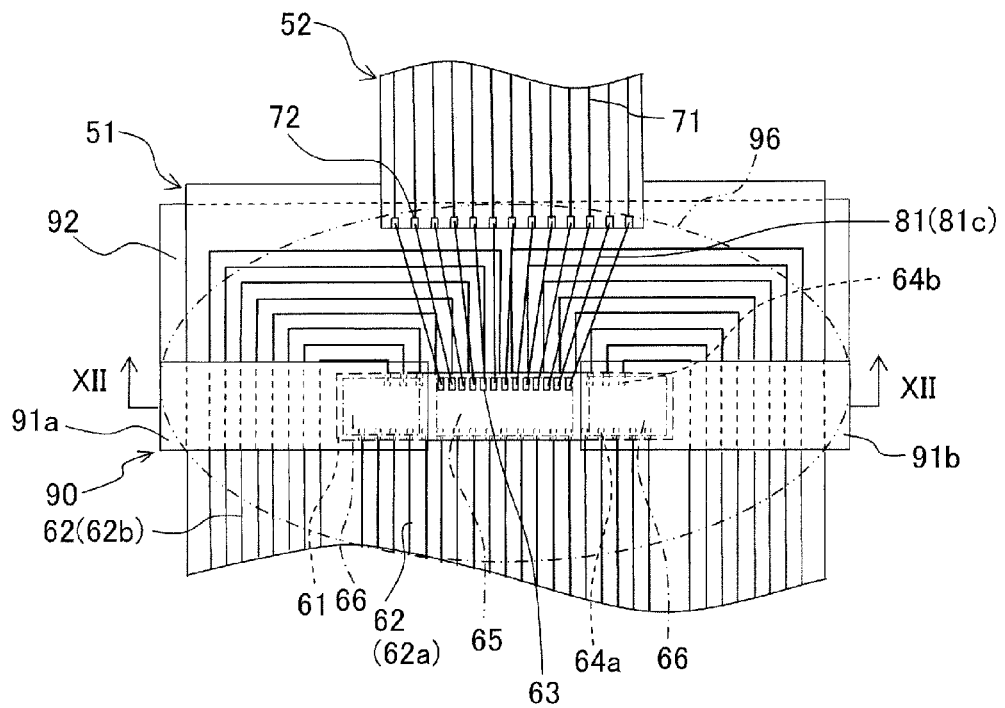
FIG. 11A is a side view observing FIG. 10A from a direction indicated by the arrow mark XIA.

Further, as shown in FIG. 11A, the first heat-radiating portion 91a is arranged to overlap with the left-portion, of the upper surface of the driver IC 61, on which the input terminals 63 are provided, and the first heat-radiating portion 91a is in contact with radiator pads 67 provided on the upper surface of the driver IC 61. Further, in the third embodiment, the radiator pads 67 are formed as gold bumps. The first heat-radiating portion 91b is arranged to overlap with the right-portion, of the upper surface of the driver IC 61, on which the input terminals 63 are provided, and the first heat-radiating portion 91b is in contact with the radiator pads 67 provided on the upper surface of the driver IC 61. That is, the first heat-radiating portions 91a and 91b are arranged on the upper surface of the driver IC 61 so that the first heat-radiating portions 91a and 91b are not in contact with the portion on which the input terminals 63 are provided.

Further, by virtue of this, the first heat-radiating portions 91a and 91b are arranged on the driver IC 61 at the portions overlapping with the drive signal output circuits 66. Further, as shown in FIG. 11A, the first heat-radiating portions 91a and 91b extend in the left and right directions (in a second direction perpendicular to a first direction), respectively, up to the outer sides beyond the COF 51.

Further, the second heat-radiating portion 92 is in contact with the portion of the lower surface of the COF 51 which overlaps with the driver IC 61, as viewed from a direction perpendicular to the plane of the paper of FIG. 11A (in a plane view). By virtue of this, the second heat-radiating portion 92 is also in contact with a metallic material which is filled in the through holes 69 of the COF 51. Further, the second heat-radiating portion 92 extends upward from a portion which overlaps with the driver IC 61, in a plane view, up to non-overlapping portion which does not overlap with the driver IC 61. The non-overlapping portion of the second heat-radiating portion 92 overlaps with the bonding wires 81, as shown in FIG. 11A. Further, the second heat-radiating portion 92 also extends in the left and right directions (in the second direction) up to the outer sides beyond the COF 51.

Figure 12:
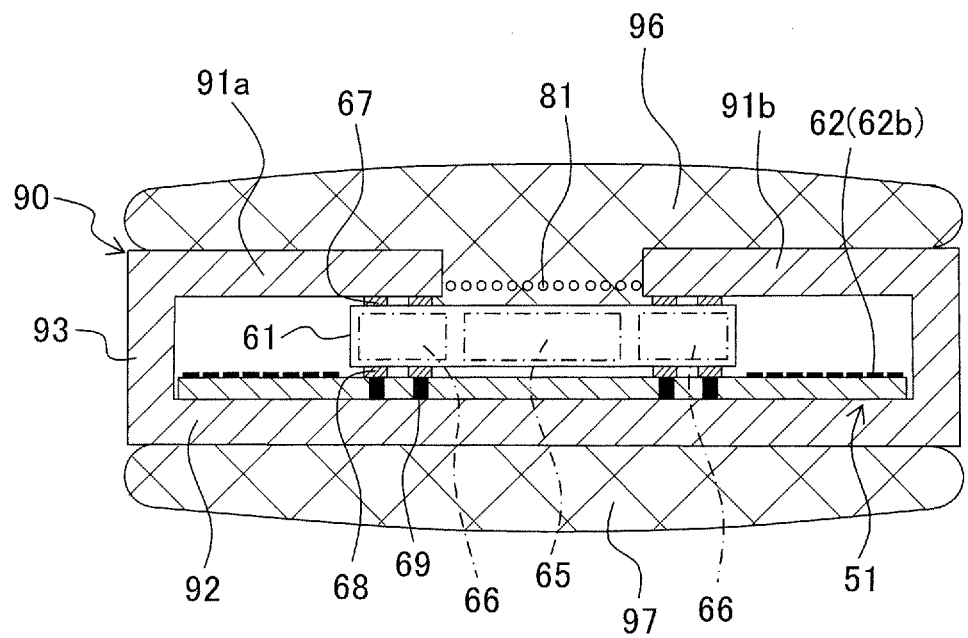
FIG. 12 a cross-sectional view taken along the line XII-XII of FIG. 11A.

As shown in FIG. 12, the connection portion 93 extends in an up-down direction to connect the outer-portions of the first heat-radiating portions 91a and 91b which are located at the both sides of the COF 51 and the outer-portions of the second heat-radiating portion 92 which are located at the both sides of the COF 51.

Further, the molded resin 96 is formed on the upper surface of the COF 51 to cover the first heat-radiating portions 91a and 91b, the driver IC 61, and the plurality of bonding wires 81. The first heat-radiating portions 91a and 91b, the driver IC 61, and the plurality of bonding wires 81 are joined with one another by the molded resin 96. Here, the molded resin 96 is formed of an insulating resin material with a thermal conductivity higher than that of air. Further, a molded resin 97 is formed, on the lower surface of the second heat-radiating portion 92, by a resin material similar to the molded resin 96.

Here, if the heat sink 90 has a large contact area with the driver IC 61, it is possible to efficiently release the heat generated in the driver IC 61. However, as described above, when the input terminals 63 provided on the upper surface of the driver IC 61 are connected to the input wires 71 on the FPC 52 by the bonding wires 81, it is impossible to arrange the first heat-radiating portions 91a and 91b and the driver IC 61 so that the first heat-radiating portions 91a and 91b are in contact with the portion of the upper surface of the driver IC 61 which overlaps with the input terminals 63. In this case, the contact area between the driver IC 61 and the first heat-radiating portions 91a and 91b becomes smaller, thereby lowering the efficiency of heat release.

However, in the third embodiment, because the second heat-radiating portion 92 is in contact with the portion of the lower surface of the COF 51 which overlaps the driver IC 61 in a plane view, the heat generated in the driver IC 61 is released not only from the first heat-radiating portions 91a and 91b but also from the second heat-radiating portion 92. Therefore, it is possible to efficiently release the heat generated in the driver IC 61.

Further, the second heat-radiating portion 92 is a large-sized member which extends up to the portion which does not overlap with the driver IC 61 in a plane view. Therefore, it is possible to efficiently release the heat generated in the driver IC 61. Further, since the portion of the second heat-radiating portion 92 which does not overlap with the driver IC 61 overlaps with the bonding wires 81, the second heat-radiating portion 92 prevents a deformation which may occur in the portion of the COF 51 which overlaps with the bonding wires 81. Thereby, it is possible to prevent disconnection of the bonding wires 81 from the input terminals 63 and from the connection terminals 72.

Here, the heat is transmitted from the driver IC 61 to the second heat-radiating portion 92 via the COF 51. However, since the synthetic resin material which is used to form the COF 51 generally has a low thermal conductivity, it seems conceivable that it is difficult to transmit the heat from the driver IC 61 to the second heat-radiating portion 92 is difficult. However, in the third embodiment, because the through holes 69 are formed in the portions of the COF 51 overlapping with the radiator pads 68 and, at the same time, the metallic material filled in the through holes 69 is in contact with the second heat-radiating portion 92, the heat generated in the driver IC 61 is efficiently transmitted to the second heat-radiating portion 92 via the radiator pads 68 and the metallic material filled in the through holes 69.

Further, in the driver IC 61, in comparison with the logic circuit 65 for processing signals at a comparatively low voltage (approximately 3.3 V, for example), the heat is more likely to be generated in the drive signal output circuits 66 for outputting the drive signal at a higher voltage than the former (approximately 20 V, for example).

In the third embodiment, the first heat-radiating portions 91a and 91b are arranged to face the portions of the driver IC 61 which overlap with the drive signal output circuits 66. Therefore, the heat generated in the drive signal output circuits 66, which are more likely to generate heat, is efficiently released from the first heat-radiating portions 91a and 91b.

Further, in the third embodiment, the single-piece heat sink 90 is formed by the first heat-radiating portions 91a and 91b which are in contact with the upper surface of the driver IC 61 and the second heat-radiating portion 92 which is in contact with the lower surface of the COF 51 being connected with the connection portion 93. Since such single-piece heat sink 90 is provided, it is possible to reduce the number of components. Further, the heat, which is transmitted from the driver IC 61 to the first heat-radiating portions 91a and 91b and the second heat-radiating portion 92, can be released not only from the first heat-radiating portions 91a and 91b and the second heat-radiating portion 92, but also from the connection portion 93. Therefore, it is possible to further efficiently release the heat generated in the driver IC 61.

Further, in the third embodiment, the output wires 62a and 62b, which are connected to the output terminals 64a and 64b provided on the two end portions of the driver IC 61, respectively, are formed on the COF 51. Therefore, the wires on the COF 51 are arranged in high density.

However, in the third embodiment, the first heat-radiating portions 91a and 91b and the second heat-radiating portion 92 extend up to the outer sides of the COF 51, and the connection portion 93 connects the portions of the first heat-radiating portions 91a and 91b located at the outer sides of the COF 51 and the portions of the second heat-radiating portion 92 located at the outer sides of the COF 51. In other words, the connection portion 93 is arranged at the outer sides of the COF 51. Therefore, the connection portion 93 does not impose a limitation on arranging the output wires 62, in contrast to a case in which the connection portion 93 is provided to pass through the COF 51. Therefore, even if the wires on the upper surface of the COF 51 are arranged in high density, it is possible to form those wires in a comparatively easy manner.

In the third embodiment, as shown in FIG. 12, the first heat-radiating portions 91a and 91b and the second heat-radiating portion 92 extend up to the outer sides of the COF 51 in the left-right direction, respectively, and the connection portion 93 connects those portions with each other. Therefore, the heat sink 90 is shaped to enclose the driver IC 61 and the COF 51, as viewed from a direction perpendicular to the plane of the paper in FIG. 12. By virtue of this, it is possible to improve the rigidity of the heat sink 90 and at the same time, to protect the driver IC 61 and the COF 51 by the heat sink 90.

Further, in the third embodiment, the molded resins 96 and 97, which are formed of a resin material with a thermal conductivity higher than air, are respectively arranged on the upper surfaces of the first heat-radiating portions 91a and 91b and on the lower surface of the second heat-radiating portion 92. Therefore, the heat transmitted from the driver IC 61 to the heat sink 90 is efficiently released to the outside.

Further, because the molded resin 96 joins the first heat-radiating portions 91a and 91b, the driver IC 61, and the plurality of bonding wires 81 with one another, the bonding wires 81 is fixed with respect to the first heat-radiating portions 91a and 91b and the driver IC 61. Thereby, it is possible to prevent disconnection of the bonding wires 81 from the input terminals 63 and from the connection terminals 72.

In addition, because the insulating molded resin 96 is arranged between the plurality of bonding wires 81, it is possible to prevent the respective bonding wires 81 from contacting and thus conducting each other.

Next, explanations will be made with respect to the modifications in which various changes are applied to the first, second, and third embodiments. However, it should be appreciated that the constitutive parts or components, which are the same as or equivalent to those of the embodiments, are designated by the same reference numerals, any explanation of which will be omitted as appropriate.

In the first to third embodiments, the input wires 71 are formed on the FPC 52 which is different from the COF 51 on which the driver IC 61 is installed. However, the input wires 71 may also be formed on the same COF 51 as that on which the driver IC 61 is installed.

Further, in the first embodiment, explanations were made with respect to the case in which the input signals to the driver IC 61 are the drive waveform signal, the jetting data signal, and the clock. However, when the signals other than the above are inputted to the driver IC 61, the bonding wire 81 with a higher loop may also be connected to the input wire 71 for inputting the signal more susceptible to the influence of noise. Further, in this case, it is also preferable that all of the input wires 71, through which signals other than the power-supply voltage signal are transmitted, are connected to the bonding wires 81 with higher loops than the loop with the bonding wire 81a connected to the power input wire 71a.

Further, in the second embodiment, the signals other than the drive waveform signal, the jetting data signal, and the clock may be inputted to the driver IC 61. In such a case, the bonding wire 91 with a shorter length may be connected to the input wire 71 for inputting the signal more susceptible to the influence of noise. Further, in this case, it is also preferable that all the input wires 71, through which signals other than the power-supply voltage signal are transmitted, are connected to the bonding wires 91 shorter than the bonding wires 91a connected to the power input wire 71a.

Further, in the first embodiment, all the bonding wires 81 had an identical length. However, the present teaching is not limited to this configuration.

For example, in the ink-jet head 3, the piezoelectric actuator 32 can be driven with altering the timing of ink jet between the nozzles 15, in order to prevent a crosstalk, that is, to prevent the deformation of the piezoelectric layer 42 in a certain portion overlapping a certain pressure chamber 10 from spreading to another portion overlapping another pressure chamber 10 to cause a change in the characteristics of jetting ink from the nozzles 15 at the time of driving the piezoelectric actuator 32. In this case, the piezoelectric actuator 32 is driven so that the timing of ink jet from the nozzles 15 which form the nozzle rows 7a of the first and third rows (odd-numbered rows) from the left (from one side of a direction) is different from the timing of ink jet from the nozzles 15 which form the nozzle rows 7b of the second and fourth rows (even-numbered rows) from the left among the four nozzle rows 7 shown in FIG. 2.

Then, in such a case, among the four nozzle rows 7 shown in FIG. 2, when the plurality of bonding wires 81c (the first wires) which are connected to the connection terminals 72 of the data signal input wires 71c (the first jet data input wires) corresponding to the nozzles 15 forming the nozzle rows 7a of the first and third rows (odd-numbered rows) from the left, mutually have an identical length, and when the plurality of bonding wires 81c (the second wires), which are connected to the connection terminals 72 of the data signal input wires 71c (the second jet data input wires) corresponding to the nozzles 15 forming the nozzle rows 7b of the second and fourth rows (even-numbered rows) from the left, mutually have another identical length, then the first wires may differ in length from the second wires.

In this case, since the plurality of bonding wires 81c (the first wires or the second wires), which correspond to the nozzles 15 jetting ink drops according to the same timing respectively, mutually have an identical length, it is possible to prevent the variation from occurring in the timing of inputting the jetting data signal corresponding to the nozzles 15 jetting ink drops according to the same timing to the driver IC 61.

Figure 6B:
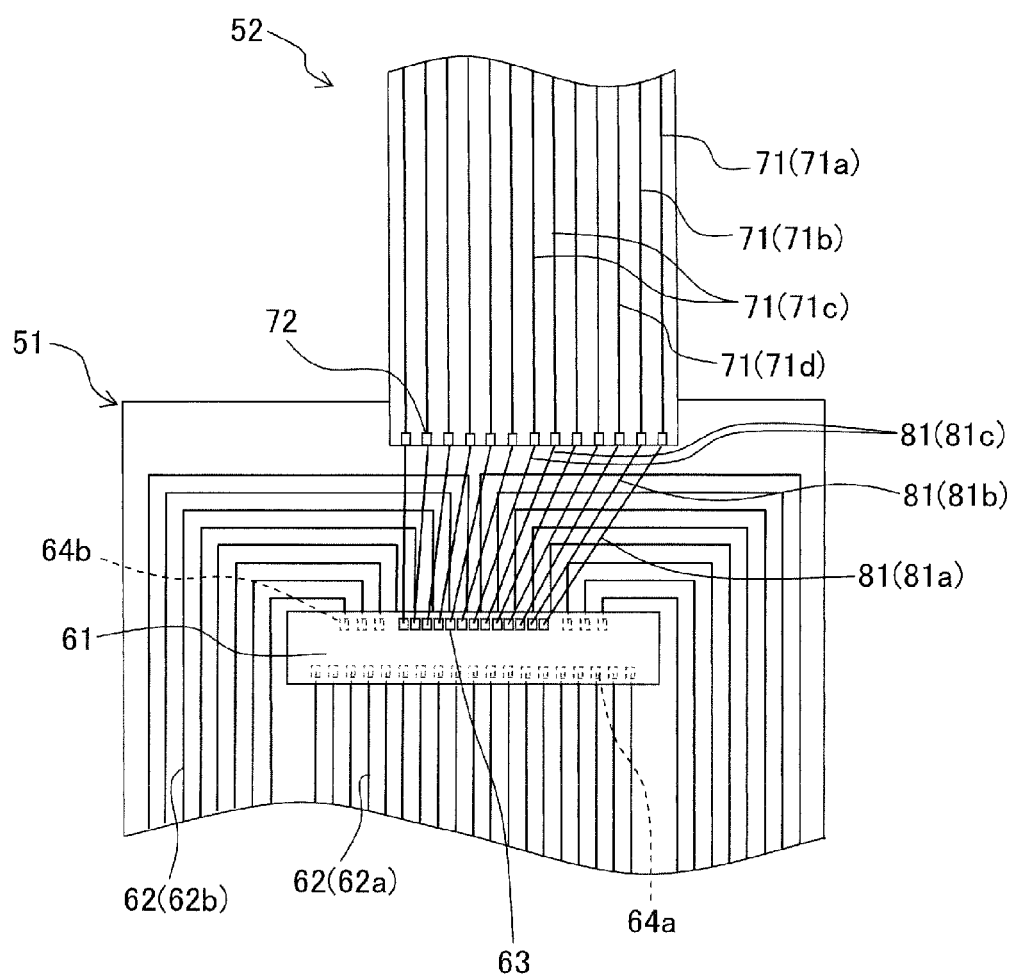
FIG. 6B is a side view corresponding to FIG. 6A in accordance with another example.

Further, other than the above examples, when the input wires 71 include a plurality of signal input wires for transmitting signals which should be inputted to the driver IC 61 at the same time, if a part of the bonding wires 81, which are connected to those signal input wires, mutually have an identical length, the part of the bonding wires 81 may also differ in length from the other bonding wires 81. Moreover, in the first and second embodiments, as shown in FIG. 6A, the FPC 52 and the driver IC 61 are arranged so that the center of the connection terminals 72 of the input wires 71 is substantially coincident with the center of the input terminals 63 of the driver IC 61. However, the present teaching is not limited to such a configuration, and the FPC 52 and the driver IC 61 can be arranged arbitrary in accordance with the design of the circuit configuration of the driver IC 61. For example, as shown in FIG. 6B, the FPC 52 and the driver IC 61 are arranged so that the left end of the connection terminals 72 of the input wires 71 is substantially coincident with the left end of the input terminals 63 of the driver IC 61.

In the third embodiment, the drive signal output circuits 66 are arranged in the portions of the driver IC 61 which overlap with the first heat-radiating portions 91a and 91b. However, the drive signal output circuits 66 may also be arranged in portions of the driver IC 61 which do not overlap with the first heat-radiating portions 91a and 91b.

In the third embodiment, because the through holes 69 filled with a metallic material are arranged at the positions which overlap with the radiator pads 68 of the driver IC 61, the radiator pads 68 become in contact with the metallic material filled in the through holes 69. However, the through holes 69 may also be formed in portions of the COF 51 which do not overlap with the radiator pads 68 as long as the portions overlap with any portions of the driver IC 61. Further, the through holes 69 may not be formed in the COF 51. Further, in the third embodiment, the radiator pads 67 and 68 are formed as gold bumps. However, the present teaching is not limited to this. The radiator pads 67 may be formed of any material in any shape as long as the driver IC 61 are connectable with the first heat-radiating portions 91a and 91b in a thermally conductible manner. In the same manner, the radiator pads 68 may also be formed of any material in any shape as long as the driver IC 61 are connectable with the metallic material arranged inside the through holes 69 in a thermally conductible manner. Further, the through holes 69 electrically conduct two members arranged to overlap with the two openings of the respective through holes 69 via the conductive material arranged in the through holes 69. Here, a conductive material such as a metallic material and the like may be filled in the through holes 69, or the conductive material such as a metallic material and the like may also be applied to the inner wall surfaces which define the through holes 69 respectively.

In the third embodiment, the molded resin 96 is arranged to cover the upper surfaces of the driver IC 61 and the first heat-radiating portions 91a and 91b and, at the same time, the molded resin 97 is arranged to cover the lower surface of the second heat-radiating portion 92. However, the present teaching is not limited to this arrangement.

For example, the molded resin 97 may not be provided but only the molded resin 96 may be provided. Further, the molded resin 96 may not be arranged on the upper surfaces of the first heat-radiating portions 91a and 91b but, for example, be only arranged within the space enclosed by the driver IC 61 and the first heat-radiating portions 91a and 91b. Further, the molded resin 96 may not be provided.

Figure 11B:
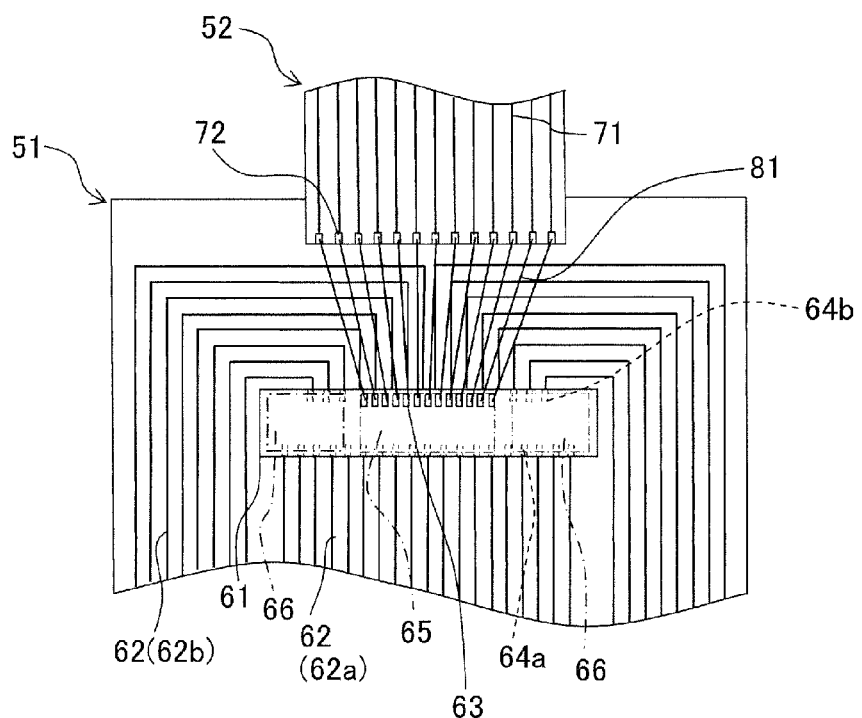
FIG. 11B is a side view observing FIG. 10B from a direction indicated by the arrow mark XIB.

In the third embodiment, the output terminals 64a and 64b are provided respectively on the two end portions of the driver IC 61 in the up-down direction of FIGS. 11A and 11B, and the output wires 61a and 62b are formed on the COF 51 to respectively connect the output terminals 64a and 64b. However, the output terminals and output wires are not limited to this arrangement. For example, only the output terminals 64a may be provided as the output terminals on the driver IC 61 and, at the same time, only the output wires 62a may be formed as the output wires on the COF 51 to be laid out from the driver IC 61 toward the piezoelectric actuator 32.

In the third embodiment, the connection portion 93 is arranged on the outer sides of the COF 51 in the left-right direction in FIG. 12. However, the connection portion 93 is not limited to this arrangement but, for example, may also be arranged to pass through the COF 51. Further, in such case, the output wires 62a and 62b must be arranged to pass by the connection portion 93. However, as described hereinabove for example, when only the output wires 62a are formed on the COF 51, that is, when the wires on the COF 51 are not arranged in such a high density, it may not become a serious problem.

Further, in the above case, the first heat-radiating portions 91a and 91b and the second heat-radiating portion 92 may not extend up to the outer sides of the COF 51 but whole of the first heat-radiating portions 91a and 91b and the second heat-radiating portion 92 may overlap with the COF 51.

Figure 13:
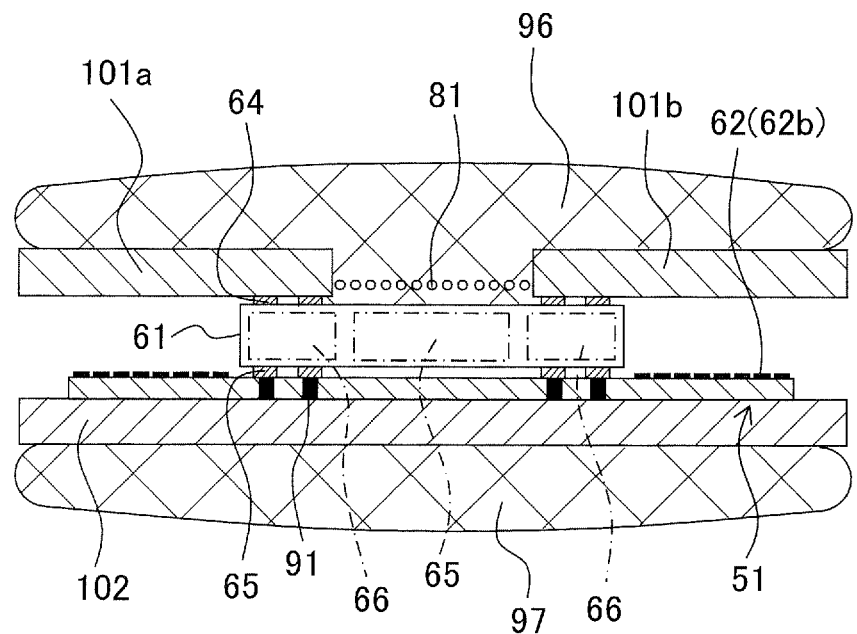
FIG. 13 a cross-sectional view corresponding to FIG. 12 in accordance with a first modification of the third embodiment.

Further, the present teaching is not limited to providing the heat sink 90 which is formed as a single-piece member in which the first heat-radiating portions 91a and 91b and the second heat-radiating portion 92 are connected by the connection portion 93. For example, instead of the heat sink 90, as shown in FIG. 13, first heat radiating members 101*a* and 101*b*, which respectively have the same configuration as the first heat-radiating portions 91*a* and 91*b*, and a second heat radiating member 102, which has the same configuration as the second heat-radiating portion 92, may also be provided separately.

In the third embodiment, the two first heat-radiating portions 91*a* and 91*b* are in contact with the upper surface of the driver IC 61, while the two first heat release members 101*a* and 101*b* are in contact with the upper surface of the driver IC 61 in the above modification. However, for example, when the input terminals 63 are provided on one of the end portions of the driver IC 61 in the left-right direction in FIGS. 11A and 11B, the upper surface of the driver IC 61 may also be in contact with one of the first heat-radiating portions or one of the heat radiating members.

Figure 14:
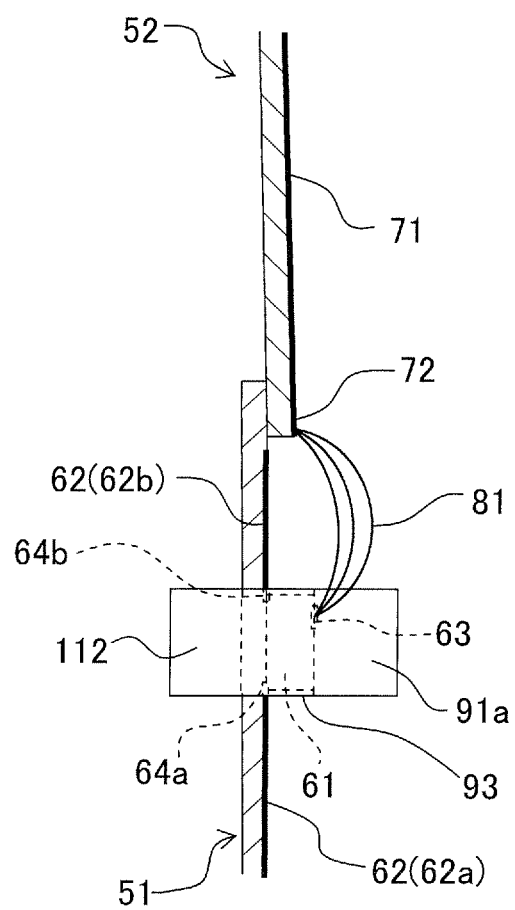
FIG. 14 a partial enlarged view corresponding to FIG. 10A in accordance with a second modification of the third embodiment.

Further, in the third embodiment, the second heat-radiating portion 92 extends up to the portion which overlaps with the bonding wires 81; however, the present teaching is not limited to this configuration. As shown in FIG. 14 for example, a second heat-radiating portion 112 may be arranged to overlap with the driver IC 61 but not overlap with the bonding wires 81. Note that the molded resins 96 and 97 as described hereinbefore are omitted to show in FIG. 14.

In the third embodiment, the input terminals 63 are provided on the upper surface of the driver IC 61, and the input terminals 63 are connected to the connection terminals 72 of the input wires 71 on the FPC 52 by the bonding wires 81. However, the connection terminals provided on the upper surface of the driver IC 61 are not limited to input terminals.

For example, the output terminals may also be provided on the upper surface of the driver IC 61, while the output wires have their connection terminals at a position on the COF 51 away from the driver IC 61, and the output terminals on the upper surface of the driver IC 61 may be connected to the connection terminals of the output wires on the COF 51 by bonding wires. Further, in such case, the input terminals 63 may be, for example, provided on the under surface of the driver IC 61, and a plurality of wires connected to the input terminals 63 may be provided on the COF 51. Then, these plurality of wires may be connected to the input wires 71 at the connecting portion connecting the COF 51 and the FPC 52.

Further, needless to say, the structure of the heat radiating mechanism (the first and second heat-radiating portions, the molded resins, and the like) described in the aforementioned third embodiment and its modifications may also be applied to any of the wiring connection structures as described in the first embodiment, the second embodiment, and their modifications.

Further, the explanations were made hereinabove with respect to the examples applying the present teaching to a printer which carries out printing by jetting ink droplets from the nozzles 15. However, the present teaching is not limited to this configuration, and it is also possible to apply the present teaching to liquid-involved apparatuses jetting other liquids than inks, and other apparatuses driven by a driver IC.

What is claimed is:

1. A wiring connection structure of driver IC comprising:
   a first wiring substrate;
   a driver IC which is installed on the first wiring substrate and which has a plurality of input terminals and a plurality of output terminals;
   a plurality of output wires which are formed on the first wiring substrate and which are connected to the output terminals of the driver IC;
   a plurality of input wires which have connection terminals to be connected to the input terminals of the driver IC, respectively, and which include a first signal input wire and a second signal input wire through which a first signal and a second signal that is more susceptible to an influence of noise than the first signal are transmitted, respectively; and
   a plurality of bonding wires which connect the input terminals of the driver IC to the connection terminals of the input wires, respectively, which have an identical length to each other, and which includes a first bonding wire having a first loop height from the first wiring substrate and a second bonding wire having a second loop height higher than the first loop height;
   wherein intervals between the input terminals are narrower than intervals between the connection terminals of the input wires;
   wherein the first signal is transmitted through the first bonding wire;
   wherein the second signal is transmitted through the second bonding wire
   wherein the driver IC serves to drive a liquid jetting head which is configured to jet a liquid droplet from a plurality of nozzles formed therein;
   wherein the plurality of kinds of signal input wires include:
      a clock wire through which a clock signal is transmitted;
      a jetting-data wire through which a jetting data signal indicating a timing of jetting the liquid droplet from the nozzles is transmitted; and
      a drive-waveform wire trough which a drive waveform signal corresponding to a drive signal to be outputted from the output terminals of the driver IC to drive the liquid jetting head is transmitted; and
   wherein loop heights of the bonding wires which are connected to the connection terminals of the clock wire and the jetting-data wire are higher than a loop height of the bonding wire which is connected to the connection terminal of the drive-waveform wire.

2. The wiring connection structure of driver IC according to claim 1 further comprising;
   a second wiring substrate on which the plurality of input wires are formed.

3. The wiring connection structure of driver IC according to claim 1;
   wherein the plurality of input wires further include a power input wire connected to a power supply and another bonding wire which is connected to a connection terminal of the power input wire;
   wherein the another bonding wire has the same length as the bonding wires which are connected to the connection terminals of the plurality of kinds of signal input wires; and
   wherein a loop height of the another bonding wire is lower than the loop heights of the bonding wires.

4. The wiring connection structure of driver IC according to claim 1;
   wherein the input terminals are provided on a surface, of the driver IC, not facing the first wiring substrate, the wiring connection structure further comprising:
      a first heat radiating member which is arranged to be in contact with a portion, of the surface of the driver IC, on which the input terminals are not provided; and
      a second heat radiating member which is arranged to be in contact with a surface of the first wiring substrate which does not face the driver IC, at a portion overlapping with the driver IC.

5. The wiring connection structure of driver IC according to claim 4;
wherein the second heat radiating member extends up to a portion, of the second heat radiating member, which does not overlap with the driver IC, and is arranged to overlap with the plurality of bonding wires.

6. The wiring connection structure of driver IC according to claim 4;
wherein the first heat radiating member and the second heat radiating member are connected with each other to form a single-piece member.

7. The wiring connection structure of driver IC according to claim 6;
wherein the first wiring substrate extends in a first direction;
wherein the plurality of bonding wires are arranged at one end-portion of the first wiring substrate in the first direction to extend from the driver IC;
wherein the first heat radiating member and the second heat radiating member extend up to an outer side of the first wiring substrate in a second direction perpendicular to the first direction; and
wherein the wiring connection structure further comprising a connection portion which connects the first heat radiating member to the second heat radiating member and which is arranged on the outer side of the first wiring substrate in the second direction.

8. The wiring connection structure of driver IC according to claim 7;
wherein the driver IC has a first output terminal arranged on the one end-portion of the first wiring substrate and a second output terminal arranged on the other end-portion of the first wiring substrate;
wherein the first wiring substrate includes a first output wire connected to the first output terminal and a second output wire connected to the second output terminal, the first and second output wires being arranged on the surface of the first wiring substrate;
wherein the second output wire is laid out from the second output terminal to the other end-portion and extends directly to the other end-portion; and
wherein the first output wire is laid out from the first output terminal to the one end-portion and then turns around to the other end-portion to pass by the driver IC to extend to the other end-portion.

9. The wiring connection structure of driver IC according to claim 4;
wherein a resin material is arranged to cover the bonding wires and to join the driver IC, the bonding wires and the first heat radiating member with one another, at a portion, of the surface of the driver IC, which overlaps with the bonding wires.

10. The wiring connection structure of driver IC according to claim 4;
wherein a through hole is formed in a part of the portion, of the first wiring substrate, on which the driver IC is installed; and
wherein a metallic material which is in contact with the second heat radiating member is filled in the through hole.

11. The wiring connection structure of driver IC according to claim 10;
wherein a radiator pad is provided on the other surface of the driver IC which faces the first wiring substrate; and
wherein the through hole is formed at a position, of the first wiring substrate, overlapping with the radiator pad so that the metallic material filled in the through hole is in contact with the radiator pad.

12. The wiring connection structure of driver IC according to claim 4;
wherein the bonding wires transmit an input signal to be inputted to the driver IC;
wherein the driver IC includes a logic circuit which is configured to process the input signal, and a drive signal output circuit which is configured to output a drive signal based on a processing result from the logic circuit; and
wherein the drive signal output circuit is arranged in a portion of the driver IC which overlaps with the first heat radiating member.

13. The wiring connection structure of driver IC according to claim 1;
wherein the connection terminals of die input wires are aligned in a row; and
wherein the first and second signal input wires are arranged in the row so that the second signal input wire is located at an inner side in the row than the first signal input wire.

14. A liquid droplet jetting apparatus which jets a liquid droplet comprising:
a liquid droplet jetting head which is configured to jet the liquid droplet and in which a plurality of nozzles are formed, the nozzles being arranged to form a plurality of nozzle rows aligned in one direction;
a first wiring substrate which is connected to the liquid droplet jetting head;
a driver IC which is installed on the first wiring substrate, which drives the liquid droplet jetting head, and which has a plurality of input terminals and a plurality of output terminals;
a plurality of output wires which are formed on the first wiring substrate and which are connected to the output terminals of the driver IC;
a plurality of input wires which have connection terminals to be connected to the input terminals, respectively; and
a plurality of bonding wires which connect the input terminals of the driver IC to the connection terminals of the plurality of input wires, respectively;
wherein intervals between the input terminals of the driver IC are narrower than intervals between the connection terminals of the input wires;
wherein the input wires include a plurality of first jetting-data wires through which a first jetting data signal is transmitted and a plurality of second jetting-data wires through which a second jetting data signal is transmitted, the first jetting data signal indicating a timing of jetting the liquid droplet from the nozzles forming odd-numbered nozzle rows from one side of the one direction, and the second jetting data signal indicating another timing of jetting the liquid droplet from the nozzles forming even-numbered nozzle rows from the one side of the one direction;
wherein the plurality of bonding wires include a plurality of first wires which are connected to the connection terminals of the plurality of first jetting-data wires, and a plurality of second wires which are connected to the connection terminals of the plurality of second jetting-data wires;
wherein the plurality of first wires mutually have an identical length, and the plurality of second wires mutually have another identical length;
wherein the plurality of kinds of signal input wires further include:

a clock wire through which a clock signal is transmitted; and a drive-waveform wire through which a drive waveform signal corresponding to a drive signal to be outputted from the output terminals of the driver IC to drive the liquid jetting head is transmitted; and wherein loop heights of the bonding wires which are connected to the connection terminals of the clock wire and the first and second jetting-data wires are higher than a loop height of the bonding wire which is connected to the connection terminal of the drive-waveform wire.

\* \* \* \* \*